(12) United States Patent
Lee

(10) Patent No.: US 11,823,615 B2
(45) Date of Patent: Nov. 21, 2023

(54) SCAN DRIVER

(71) Applicant: SAMSUNG DISPLAY CO., LTD., Yongin-si (KR)

(72) Inventor: Jae Hoon Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/590,535

(22) Filed: Feb. 1, 2022

(65) Prior Publication Data

US 2022/0366836 A1 Nov. 17, 2022

(30) Foreign Application Priority Data

May 12, 2021 (KR) .................. 10-2021-0061609

(51) Int. Cl.
*G09G 3/32* (2016.01)
(52) U.S. Cl.
CPC ....... *G09G 3/32* (2013.01); *G09G 2310/0267* (2013.01); *G09G 2310/061* (2013.01); *G09G 2310/08* (2013.01); *G09G 2320/0214* (2013.01)
(58) Field of Classification Search
None
See application file for complete search history.

(56) References Cited

U.S. PATENT DOCUMENTS

| 9,536,476 | B2 * | 1/2017 | Cao ...................... G09G 3/3258 |
| 10,878,745 | B2 | 12/2020 | Park et al. |
| 10,891,903 | B2 | 1/2021 | Takasugi |
| 11,056,058 | B2 | 7/2021 | Lee et al. |
| 11,183,124 | B2 * | 11/2021 | Choi .................... G09G 3/3266 |
| 2015/0154928 | A1 * | 6/2015 | Abe ...................... G09G 3/3677 377/79 |
| 2015/0325181 | A1 * | 11/2015 | Wang .................. G09G 3/3677 377/64 |
| 2020/0066211 | A1 * | 2/2020 | Lee ....................... G09G 3/3225 |
| 2020/0184898 | A1 * | 6/2020 | Choi .................... G09G 3/3233 |
| 2020/0193912 | A1 * | 6/2020 | Park .................... G09G 3/3275 |
| 2020/0333391 | A1 * | 10/2020 | Park .................... G09G 3/3266 |

(Continued)

FOREIGN PATENT DOCUMENTS

| KR | 10-2018-0127896 | 11/2018 |
| KR | 10-2020-0022066 | 3/2020 |

(Continued)

*Primary Examiner* — Patrick N Edouard
*Assistant Examiner* — Peijie Shen
(74) *Attorney, Agent, or Firm* — F. Chau & Associates, LLC

(57) ABSTRACT

A scan driver includes a plurality of stages. A n-th stage among the plurality of stages includes a first input unit controlling a voltage of a first node in response to a previous carry signal, a scan output unit outputting a current scan signal corresponding to a scan clock signal in response to the voltage of the first node, a first switching unit controlling a voltage of a second node in response to the previous carry signal, a sensing output unit outputting a current sensing signal corresponding to a sensing clock signal in response to the voltage of the second node, a carry output unit outputting a current carry signal corresponding to a carry clock signal in response to the voltage of the second node, and a second switching unit controlling the voltage of the second node in response to the sensing clock signal or the carry clock signal.

21 Claims, 15 Drawing Sheets

140: 141, 142, 143

(56) References Cited

U.S. PATENT DOCUMENTS

| | | | | |
|---|---|---|---|---|
| 2020/0372851 | A1* | 11/2020 | Kim | G09G 3/2092 |
| 2021/0056908 | A1* | 2/2021 | Park | G09G 3/3275 |
| 2021/0056910 | A1* | 2/2021 | Chung | G11C 19/28 |
| 2021/0104197 | A1* | 4/2021 | Choi | G09G 3/3266 |
| 2021/0201814 | A1* | 7/2021 | Choi | G09G 3/3266 |
| 2022/0108656 | A1* | 4/2022 | Lee | G09G 3/3266 |
| 2022/0122527 | A1* | 4/2022 | Feng | G09G 3/3225 |

FOREIGN PATENT DOCUMENTS

| | | |
|---|---|---|
| KR | 10-2020-0100247 | 8/2020 |
| KR | 10-2020-0137072 | 12/2020 |
| KR | 10-2022-0046067 | 4/2022 |

\* cited by examiner

140: 141, 142, 143

SCAN DRIVER

CROSS-REFERENCE TO RELATED APPLICATION

This U.S. non-provisional patent application claims priority under 35 U.S.C. § 119 to Korean Patent Application No. 10-2021-0061609 filed on May 12, 2021, the entire disclosure of which is incorporated by reference in its entirety herein.

1. TECHNICAL FIELD

The disclosure relates to a scan driver.

2. DISCUSSION OF RELATED ART

A display device includes a plurality of pixels and a driver for driving the pixels. The driver provides an image signal applied from an external graphic processor to the pixels. The graphic processor generates an image signal by rendering raw data. A rendering time for rendering the raw data to generate the image signal corresponding to one frame may vary. Further, the driver may vary a frame rate in response to the rendering time.

A n-th one of the pixels may include a pixel unit including a plurality of transistors and capacitors, and a light emitting element. The pixel unit may supply a current of a driving transistor according to a data voltage to the light emitting element when a scan signal is received. The light emitting element may emit light with an intensity corresponding to the current of the driving transistor.

However, an electrical characteristic of the driving transistor may deviate due to process deviation or deterioration, and thus a desired grayscale may not be achieved.

SUMMARY

At least one embodiment of the disclosure provides a scan driver for preventing an unnecessary data voltage from being applied to a pixel row by a scan signal when a sensing signal for external compensation is applied.

A scan driver according to an embodiment of the disclosure includes a plurality of stages, and an n-th stage among the plurality of stages includes a first input unit controlling a voltage of a first node in response to a previous carry signal, a scan output unit outputting a current scan signal corresponding to a scan clock signal in response to the voltage of the first node, a first switching unit controlling a voltage of a second node in response to the previous carry signal, a sensing output unit outputting a current sensing signal corresponding to a sensing clock signal in response to the voltage of the second node, a carry output unit outputting a current carry signal corresponding to a carry clock signal in response to the voltage of the second node, and a second switching unit controlling the voltage of the second node in response to the sensing clock signal or the carry clock signal.

The n-th stage may further include a second input unit controlling the voltage of the first node in response to a next carry signal.

The n-th stage may further include a third switching unit controlling the voltage of the first node in response to the scan clock signal.

In an embodiment, the voltage of the first node is discharged by the second input unit, and the voltage of the second node is not discharged.

The first input unit may include a first transistor connected between a first input terminal and the first node, and having a gate electrode connected to the first input terminal, the scan output unit may include a second transistor connected between a scan clock input terminal and a first output terminal, and having a gate electrode connected to the first node, the first switching unit may include a third transistor connected between the first input terminal and the second node, and having a gate electrode connected to the first input terminal, the sensing output unit may include a fourth transistor connected between a sensing clock input terminal and a second output terminal, and having a gate electrode connected to the second node, and the carry output unit may include a fifth transistor connected between a carry clock input terminal and a carry output terminal, and having a gate electrode connected to the second node.

The second switching unit may include a sixth transistor connected between the second node and a third node, and having a gate electrode connected to the sensing clock input terminal or the carry clock input terminal, and the third switching unit may include a seventh transistor connected between the first node and the third node, and having a gate electrode connected to the scan clock input terminal.

The second input unit may include an eighth transistor connected between the first node and a second power input terminal, and having a gate electrode connected between a second input terminal.

An output unit may include the scan output unit, the carry output unit, and the sensing output unit may configure an output unit, and the output unit may include a ninth transistor connected between a first power input terminal and the first output terminal, and having a gate electrode connected to a fourth node, a tenth transistor connected between the second power input terminal and the carry output terminal, and having a gate electrode connected to the fourth node, an eleventh transistor connected between the second power input terminal and the carry output terminal, and having a gate electrode connected to the second input terminal, a twelfth transistor connected between the first power input terminal and the second output terminal, and having a gate electrode connected to the fourth node, and a thirteenth transistor connected between the first power input terminal and the second output terminal, and having a gate electrode connected to the second input terminal.

The n-th stage may further include a first control unit controlling a voltage of the first output terminal in response to the next carry signal, and the first control unit may include a fourteenth transistor connected between the first power input terminal and the first output terminal, and having a gate electrode connected to the second input terminal.

The n-th stage may further include a second control unit controlling a voltage of the third node in response to a voltage of the fourth node, and the second control unit may include a fifteenth transistor connected between the second power input terminal and the third node, and having a gate electrode connected to the fourth node.

The n-th stage may further include a third control unit controlling the voltage of the fourth node in response to the carry clock signal and the current carry signal, and the third control unit may include a sixteenth transistor connected between the carry clock input terminal and a fifth node, and having a gate electrode connected to the carry clock input terminal, a seventeenth transistor connected between the carry clock input terminal and the fourth node, and having a gate electrode connected to the fifth node, an eighteenth transistor connected between the first power input terminal and the fifth node, and having a gate electrode connected to the carry output terminal, and a nineteenth transistor connected between the second power input terminal and the fourth node, and having a gate electrode connected to the carry output terminal.

The n-th stage may further include a leakage control unit supplying a control voltage supplied to a third input terminal in response to the current scan signal and the current sensing signal to the first input unit, the second input unit, and the first switching unit, and the leakage control unit may include a twentieth transistor connected between the third input terminal and a sixth node, and having a gate electrode connected to the first output terminal, and a twenty-first transistor connected between the third input terminal and the sixth node, and having a gate electrode connected to the second output terminal.

The n-th stage may further include a first reset unit resetting the voltage of the first node in response to a reset signal supplied to a fourth input terminal, and the first reset unit may include twenty-second transistor connected between the second power input terminal and the first node, and having a gate electrode connected to the fourth input terminal.

The voltage of the first node may be discharged by the second input unit, and the voltage of the second node may not be discharged.

The n-th stage may further include a second reset unit controlling the voltage of the second node in response to a reset signal supplied to a fourth input terminal, and the second reset unit may include a twenty-third transistor connected between a second power input terminal and the second node, and having a gate electrode connected to the fourth input terminal.

A scan driver according to an embodiment includes a plurality of stages, and a n-th stage among the plurality of stages includes a first input unit controlling a voltage of a first node in response to a previous carry signal, a second input unit controlling the voltage of the first node in response to a next carry signal, a scan output unit outputting a current scan signal corresponding to a scan clock signal in response to the voltage of the first node, a first switching unit controlling a voltage of a second node in response to the previous carry signal, a sensing output unit outputting a current sensing signal corresponding to a sensing clock signal in response to the voltage of the second node, a carry output unit outputting an n-th carry signal corresponding to a carry clock signal in response to the voltage of the second node, and a second switching unit controlling the voltage of the first node in response to the scan clock signal.

In an embodiment, the voltage of the first node is discharged by the second input unit, and the voltage of the second node is not discharged.

A scan driver according to an embodiment includes a plurality of stages, and a first stage among the plurality of stages includes a first transistor connected to a first scan clock line and a first output terminal, and having a gate electrode connected to one electrode of a control transistor, a second transistor connected to a first sensing clock line and a second output terminal, and having a gate electrode connected to a first node, a third transistor connected to a first carry clock line and a carry output terminal, and having a gate electrode connected to the first node, and a control transistor having a gate electrode connected to the first scan clock line, one electrode connected to the gate electrode of the first transistor, and another electrode connected to the first node.

A second stage among the plurality of stages includes a twenty-eighth transistor connected between a first output terminal and a second scan clock line, and having a gate electrode connected to one electrode of a control transistor, a twenty-ninth transistor connected between a second output terminal and a second sensing clock line, and having a gate electrode connected to a second node, a thirtieth transistor connected between a second carry line and a second carry clock line, and having a gate electrode connected to the second node, and the control transistor having a gate electrode connected to the second scan clock line, the one electrode connected to the gate electrode of the twenty-eighth transistor, and another electrode connected to the second node.

The first output terminal may output a scan signal, the second output terminal may output a sensing signal, and the carry output terminal may output a carry signal.

A scan driver according to an embodiment includes a plurality of stages, and an n-th stage among the plurality of stages includes a first transistor connected between a first input terminal and a first node, and having a gate electrode connected to the first input terminal, a second transistor connected between a scan clock input terminal and a first output terminal, and having a gate electrode connected to the first node, a third transistor connected between the first input terminal and a second node, and having a gate electrode connected to the first input terminal, a fourth transistor connected between a sensing clock input terminal and a second output terminal, and having a gate electrode connected to the second node, and a fifth transistor connected between a carry clock input terminal and a carry output terminal, and having a gate electrode connected to the second node.

The scan driver may further include a sixth transistor connected between the second node and a third node, and having a gate electrode connected to the sensing clock input terminal or the carry clock input terminal, and a seventh transistor connected between the first node and the third node, and having a gate electrode connected to the scan clock input terminal.

According to an embodiment, the scan driver may include a switching unit to connect a gate electrode of each transistor for outputting a scan signal and a sensing signal to a separate node, and control an electrical connection between a node to which the gate electrode of each transistor is connected and a control unit.

Therefore, when a sensing signal for external compensation is applied, an unnecessary data voltage may be prevented from being applied to a pixel row by a scan signal. UNITUNITUNITUNITUNITUNITUNITUNIT

BRIEF DESCRIPTION OF THE DRAWINGS

The disclosure will become more apparent by describing in further detail embodiments thereof with reference to the accompanying drawings, in which.

DETAILED DESCRIPTION OF THE EMBODIMENTS

Figure 1:
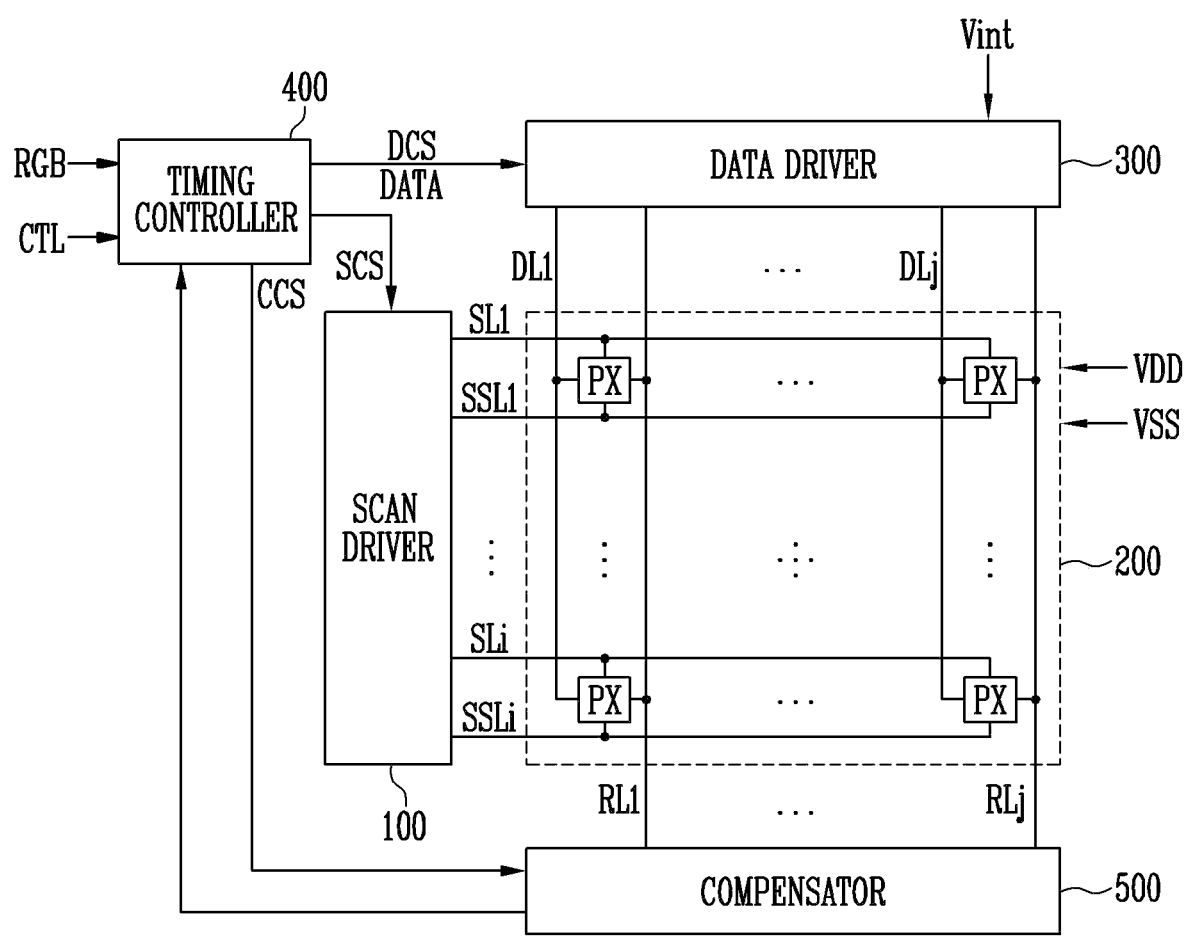
FIG. 1 is a block diagram schematically illustrating a display device according to an embodiment.

The disclosure may be modified in various manners and have various forms. Therefore, specific embodiments will be illustrated in the drawings and will be described in detail in the specification. However, it should be understood that the disclosure is not intended to be limited to the disclosed specific forms, and the disclosure includes all modifications, equivalents, and substitutions within the spirit and technical scope of the disclosure.

Terms of "first", "second", and the like may be used to describe various components, but the components should not be limited by the terms. The terms are used only for the purpose of distinguishing one component from another component. For example, without departing from the scope of the disclosure, a first component may be referred to as a second component, and similarly, a second component may also be referred to as a first component. The singular expressions include plural expressions unless the context clearly indicates otherwise.

It should be understood that in the present application, a term of "include", "have", or the like is used to specify that there is a feature, a number, a step, an operation, a component, a part, or a combination thereof described in the specification, but does not exclude a possibility of the presence or addition of one or more other features, numbers, steps, operations, components, parts, or combinations thereof in advance.

Hereinafter, a display device including a scan driver according to an embodiment of the disclosure is described with reference to drawings related to embodiments of the disclosure.

FIG. 1 is a block diagram schematically illustrating a display device according to an embodiment.

Referring to FIG. 1, the display device may include a scan driver 100 (e.g., a driver circuit), a pixel unit 200 (e.g., a display panel), a data driver 300 (e.g., driver circuit), a timing controller 400 (e.g., a control circuit), and a compensator 500 (e.g., a logic circuit).

The display device may be a flat display device, a flexible display device, a curved display device, a foldable display device, or a bendable display device. In addition, the display device may be applied to a transparent display device, a head-mounted display device, a wearable display device, and the like.

The display device may be implemented as a self-emission display device including a plurality of self-emission elements. For example, the display device may be an organic light emitting display device including organic light emitting elements, a display device including inorganic light emitting elements, or a display device including light emitting elements configured of an inorganic material and an organic material in combination. However, this is an example, and the display device may be implemented as a liquid crystal display device, a plasma display device, a quantum dot display device, or the like.

The scan driver 100 may receive a scan control signal SCS from the timing controller 400 and generate a scan signal and a sensing signal based on the scan control signal SCS. In an embodiment, the scan control signal SCS includes a scan start signal STV or the timing controller 400 provides the scan start signal STV to the scan driver 100 separate from the scan control signal SCS.

The scan driver 100 may provide the scan signal to scan lines SL1 to SLi (i is a natural number), and may provide the sensing signal to sensing control lines SSL1 to SSLi (i is a natural number). For example, the scan signal may be set to a gate-on voltage at which a transistor included in a pixel PX may be turned on, and the scan signal may be used for applying a data signal (or a data voltage) to the pixel PX. In addition, the sensing signal may be set to a gate-on voltage at which the transistor included in the pixel PX may be turned on, and the sensing signal may be used for sensing (or extracting) a driving current flowing through the pixel PX or applying an initialization voltage Vint to the pixel PX. A time point and a waveform at which the scan signal and the sensing signal are supplied may be set differently according to an active period, a sensing period, a vertical blank period, and the like.

The pixel unit 200 includes the pixel PX connected to the scan lines SL1 to SLi, the sensing control lines SSL1 to SSLi, data lines DL1 to DLj, and sensing lines RL1 to RLj. In addition, the pixel unit 200 may include the pixels PX connected to the plurality of scan lines SL1 to SLi, the plurality of sensing control lines SSL1 to SSLi, the plurality of data lines DL1 to DLj, and the plurality of sensing lines RL1 to RLj, respectively.

The pixel unit 200 may receive a first driving voltage VDD, a second driving voltage VSS, and the initialization voltage Vint from an outside source such as a voltage generator.

Meanwhile, in FIG. 1, only the scan lines SL1 to SLi and the sensing control lines SSL1 to SSLi are connected to the pixel PX, but the disclosure is not limited thereto. According to an embodiment, the pixel unit 200 may further include one or more emission control lines, or the like in correspondence with a circuit structure of the pixel PX.

The data driver 300 may receive a data control signal DCS from the timing controller 400, convert digital image data (or image data) to an analog data signal (or the data voltage) based on the data control signal DCS, and provide the data voltage (or the data signal) to the data lines DL1 to DLj (j is a natural number). For example, the data driver 300 may supply the data signal (or the data voltage) to the data lines DL1 to DLj during the active period of one frame (or frame period). The data signal may be a data voltage for displaying an effective image, and may be a value corresponding to the digital image data (or the image data).

In addition, the data driver 300 may supply the initialization voltage Vint to the sensing lines RL1 to RLj (j is a natural number) under control of the timing controller 400. In an embodiment, the data driver 300 separately supplies the initialization voltage Vint for display and sensing, under the control of the timing controller 400. For example, in the active period of one frame, the data driver 300 may supply the initialization voltage Vint different from the second driving voltage VSS to the sensing lines RL1 to RLj.

The timing controller 400 may receive an image signal RGB and a timing control signals CTL from the outside (for example, a graphic processor). The timing control signals CTL may include a dot clock signal, a data enable signal, a vertical synchronization signal, a horizontal synchronization signal, and the like.

The timing controller 400 may generate the scan control signal SCS for controlling a driving timing of the scan driver 100 and provide the scan control signal SCS to the scan driver 100 and may generate the data control signal DCS for controlling a driving timing of the data driver 300 and provide the data control signal DCS to the data driver 300, using the timing control signals CTL supplied from the outside and timing setting information stored therein. In addition, the timing controller 400 may provide a compensation control signal CCS for controlling the compensator 500 to the compensator 500.

The scan control signal SCS may include a scan start signal and clock signals. The scan start signal controls a first timing of the scan signal. The clock signals may be used to shift the scan start signal.

The data control signal DCS may include a source start signal and clock signals. The source start signal controls a sampling start time of data. The clock signals may be used to control a sampling operation.

The compensation control signal CCS may control driving of the compensator 500 for sensing the pixel PX and compensating for deterioration of the pixel PX.

The compensator 500 may receive at least one sensing current from at least one of the pixels PX through the sensing lines RL1 to RLj. For example, the compensator 500 may receive the sensing current from the pixels PX of one horizontal line (pixel row) in the vertical blank period (for example, the sensing period) between adjacent active periods. The sensing current may include information on a threshold voltage, mobility, and/or the like of the driving transistor (or a first pixel transistor) included in the sensed pixel PX.

In addition, the compensator 500 may calculate a characteristic of the driving transistor based on the sensing current and provide sensing data corresponding to the calculated characteristic to the timing controller 400 or the data driver 300. The timing controller 400 or the data driver 300 may compensate for the digital image data and/or the data signal based on the sensed data.

Hereinafter, a structure of the pixel PX is described with reference to FIG. 2.

Figure 2:
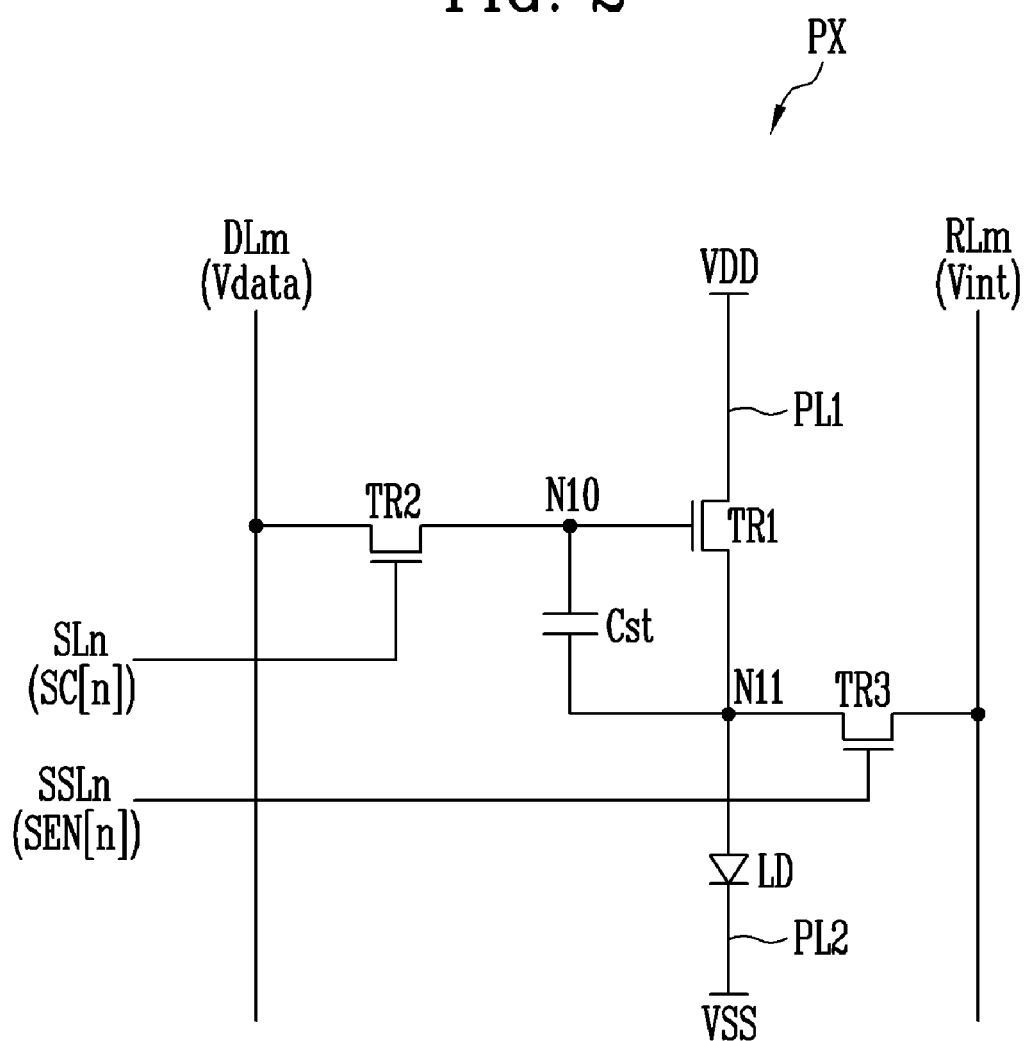
FIG. 2 is a circuit diagram illustrating an example of a pixel included in the display device of FIG. 1.

FIG. 2 is a circuit diagram illustrating an example of the pixel included in the display device of FIG. 1. FIG. 2 illustrates the pixel PX included in an n-th pixel row and an m-th pixel column (where n and m are natural numbers).

Referring to FIG. 2, the pixel PX may include a light emitting element LD, a first pixel transistor TR1, a second pixel transistor TR2, a third pixel transistor TR3, and a storage capacitor Cst.

The light emitting element LD may generate light of a predetermined luminance in response to a current amount supplied from the first pixel transistor TR1. The light emitting element LD includes a first electrode and a second electrode, the first electrode is connected to an eleventh node N11, and the second electrode is connected to a second power line PL2 to which the second driving voltage VSS is applied. In an embodiment, the first electrode may be an anode and the second electrode may be a cathode. According to an embodiment, the first electrode may be a cathode, and the second electrode may be an anode.

In an embodiment, the light emitting element LD may be an inorganic light emitting element formed of an inorganic material. According to an embodiment, the light emitting element LD may be an organic light emitting diode including an organic light emitting layer. In addition, the light emitting element LD may be a light emitting element configured of an inorganic material and an organic material in combination.

A first electrode of the first pixel transistor TR1 (or the driving transistor) may be connected to a first power line PL1 to which the first driving voltage VDD is applied, and a second electrode of the first pixel transistor TR1 may be connected to the first electrode (or the eleventh node N11) of the light emitting element LD. A gate electrode of the first pixel transistor TR1 may be connected to a tenth node N10. In an embodiment, the first electrode may be a drain electrode, and the second electrode may be a source electrode. In an embodiment, the second driving voltage VSS is a ground voltage. In an embodiment, the first driving voltage VDD is higher than the second driving voltage VSS.

The first pixel transistor TR1 may control a current amount flowing into the light emitting element LD in response to a voltage of the tenth node N10. The first pixel transistor TR1 may be turned on when a voltage between the tenth node N10 and the eleventh node N11 (that is, a gate-source voltage) is higher than a threshold voltage.

A first electrode of the second pixel transistor TR2 (or a switching transistor) may be connected to an m-th data line DLm, and a second electrode of the second pixel transistor TR2 may be connected to the tenth node N10 (or the gate electrode of the first pixel transistor TR1). A gate electrode of the second pixel transistor TR2 may be connected to an n-th scan line SLn.

The second pixel transistor TR2 may be turned on when an n-th scan signal SC[n] (for example, a high level voltage) is supplied to the n-th scan line SLn, to transmit a data voltage Vdata from the m-th data line DLm to the tenth node N10.

A first electrode of the third pixel transistor TR3 may be connected to an m-th sensing line RLm, and a second electrode of the third pixel transistor TR3 may be connected to the eleventh node N11 (or the second electrode of the first pixel transistor TR1). A gate electrode of the third pixel transistor TR3 may be connected to an n-th sensing control line SSLn.

The third pixel transistor TR3 may be turned on when an n-th sensing signal SEN[n] (for example, a high level voltage) is supplied to the n-th sensing control line SSLn, to electrically connect an m-th sensing line RLm and the eleventh node N11. Accordingly, the initialization voltage Vint may be provided to the eleventh node N11 during a predetermined time.

In addition, when an n-th sensing signal SEN[n] is supplied to the n-th sensing control line SSLn, the third pixel transistor TR3 may be turned on, and thus a sensing current (or a sensing voltage) corresponding to a node voltage of the eleventh node N11 may be transmitted to the m-th sensing line RLm. The sensing current may be provided to the compensator 500 (refer to FIG. 1) through the m-th sensing line RLm. For example, in the vertical blank period of the adjacent active period, the threshold voltage and/or the mobility of the first pixel transistor TR1 of one pixel PX may be sensed through the sensing current. In order to sense the threshold voltage and/or the mobility of the first pixel transistor TR1, the n-th sensing signal SEN[n] applied to the third pixel transistor TR3 may be referred to as the sensing signal SEN[n] for external compensation.

The storage capacitor Cst is connected between the tenth node N10 and the eleventh node N11. The storage capacitor Cst may be charged with the data voltage Vdata corresponding to the data signal supplied to the tenth node N10 during one frame (or frame period). Accordingly, the storage capacitor Cst may store a voltage corresponding to a voltage difference between the tenth node N10 and the eleventh node N11. Here, when the data voltage Vdata is supplied, the initialization voltage Vint may be supplied to the eleventh node N11, and thus the storage capacitor Cst may store a voltage difference between the data voltage Vdata and the initialization voltage Vint. Whether the first pixel transistor TR1 is turned on or turned off may be determined according to the voltage stored in the storage capacitor Cst.

However, in the disclosure, a circuit structure of the pixel PX is not limited to FIG. 2. For example, the light emitting element LD may be positioned between the first power line PL1 connected to the first driving voltage VDD and the first electrode of the first pixel transistor TR1.

In FIG. 2, the transistor is shown an N-channel metal-oxide semiconductor (NMOS) transistor, but the disclosure is not limited thereto. For example, at least one of the first to third pixel transistors TR1, TR2, and TR3 may be implemented as a P-channel metal-oxide semiconductor (PMOS) transistor. In addition, the first to third pixel transistors TR1, TR2, and TR3 shown in FIG. 2 may be thin film transistors including at least one of an oxide semiconductor, an amorphous silicon semiconductor, and a polycrystalline silicon semiconductor.

Hereinafter, a scan driver of a display device according to an embodiment is described with reference to FIG. 3.

Figure 3:
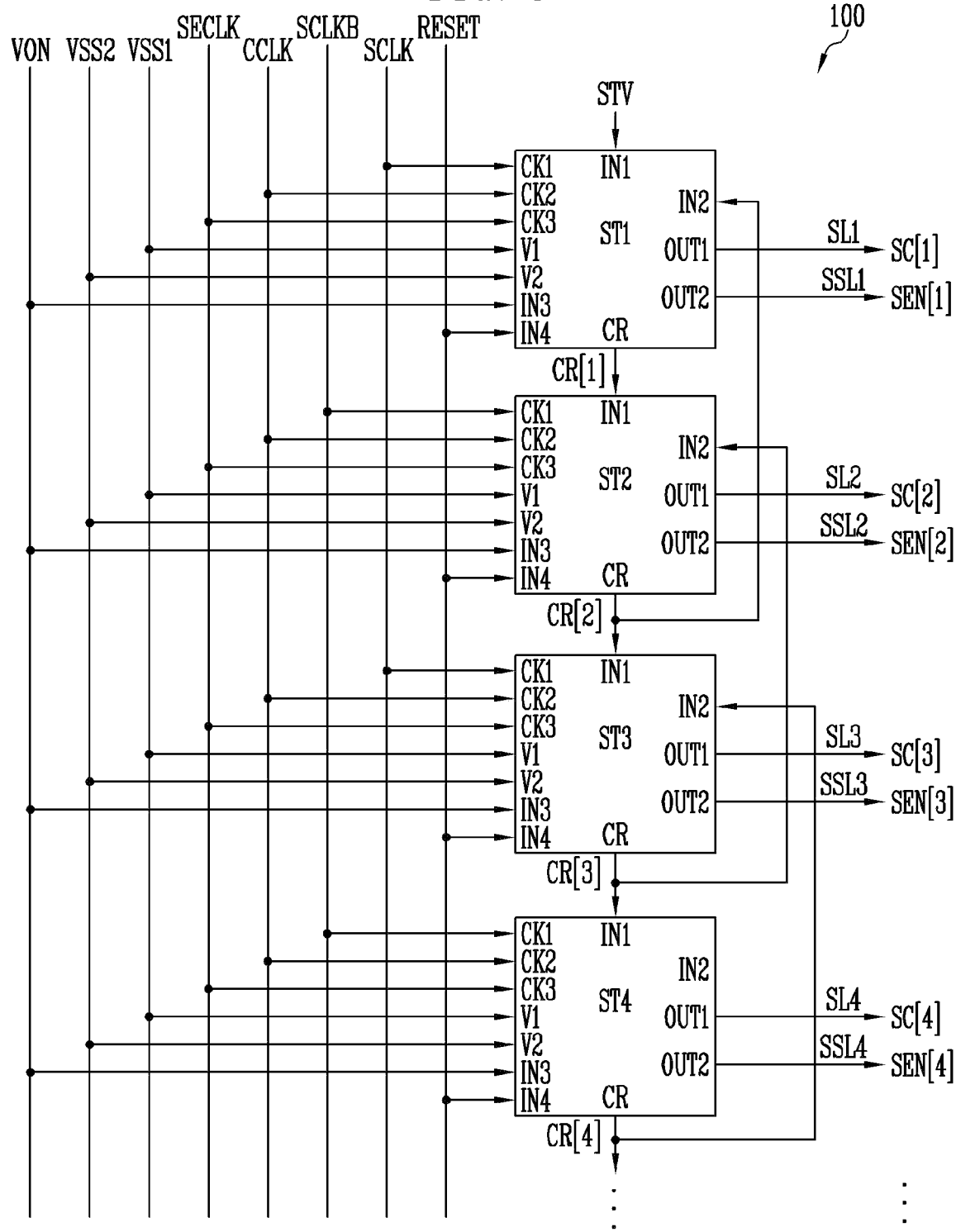
FIG. 3 is a diagram illustrating a scan driver according to an embodiment.

FIG. 3 is a diagram illustrating a scan driver according to an embodiment.

Referring to FIG. 3, the scan driver 100 includes a plurality of stages ST1, ST2, ST3, ST4, . . . . For example, each of the stages may be a separate unit, IC chip, or component that operate concurrently. For example, the stages may be cascade connected to one another. The . . . notation indicates that there may be more than four stages.

The plurality of stages ST1 (e.g., a first unit), ST2 (e.g., a second unit), ST3 (e.g., a third unit), ST4 (e.g., a fourth unit), . . . may output scan signals SC[1], SC[2], SC[3], SC[4], . . . in response to a scan start signal STV and/or carry signals CR[1], CR[2], CR[3], CR[4], . . . . The scan start signal STV controlling a timing of the first scan signal SC[1] may be supplied to the first stage ST1.

One stage STn may include a scan clock input terminal CK1, a carry clock input terminal CK2, a sensing clock input terminal CK3, a first input terminal IN1, a second input terminal IN2, a third input terminal IN3, a fourth input terminal IN4, a carry output terminal CR, a first output terminal OUT1, a second output terminal OUT2, a first power input terminal V1, and a second power input terminal V2.

The scan clock input terminal CK1 may receive first and second scan clock signals SCLK and SCLKB corresponding to an output of the scan signals SC[1], SC[2], SC[3], SC[4], . . . . For example, each of the stages ST1, ST2, ST3, ST4, . . . may receive a first scan clock signal SCLK or a second scan clock signal SCLKB through the scan clock input terminal CK1. For example, odd-numbered stages ST1, ST3, . . . may receive the first scan clock signal SCLK, and even-numbered stages ST2, ST4, . . . may receive the second scan clock signal SCLKB.

The first scan clock signal SCLK may be set as a square wave signal that repeats a logic high level and a logic low level. Here, the logic high level may correspond to a gate-on voltage, and the logic low level may correspond to a gate-off voltage.

The second scan clock signal SCLKB may be set as a square wave signal that repeats a logic high level and a logic low level. In an embodiment, the second scan clock signal SCLKB may be set as a signal of which a period is the same as that of the first scan clock signal SCLK and a phase is inverted. However, this is an example, and a waveform relationship between the first scan clock signal SCLK and the second scan clock signal SCLKB is not limited thereto. For example, a portion of a logic high level period of the first scan clock signal SCLK and a portion of a logic high level period of the second scan clock signal SCLKB may overlap.

The carry clock input terminal CK2 may receive a carry clock signal CCLK corresponding to an output of the carry signals CR[1], CR[2], CR[3], CR[4], . . . .

The sensing clock input terminal CK3 may receive a sensing clock signal SECLK corresponding to an output of sensing signals SEN[1], SEN[2], SEN[3], SEN[4], . . . .

The first input terminal IN1 may receive the scan start signal STV or a carry signal of a previous stage. That is, the scan start signal SW may be supplied to the first input terminal IN1 of the first stage ST1, and the carry signal of the previous stage may be applied to the first input terminal IN1 of each of the stages other than the first stage ST1. For example, the carry signal CR[1] of the first stage ST1 may be applied to the second stage ST2, and the carry signal CR[2] of the second stage ST2 may be applied to the third stage ST3.

The second input terminal IN2 may receive a carry signal of a next stage. That is, the carry signal of the next stage may be one of the carry signals supplied after a predetermined time after the output of the carry signal of the current stage. For example, the carry signal CR[2] of the second stage ST2 may be applied to the second input terminal IN2 of the first stage ST1, and the carry signal CR[3] of the third stage ST3 may be applied to the second input terminal IN2 of the second stage ST2.

The third input terminal IN3 may receive a control voltage VON. In an embodiment, the control voltage VON may be a high potential voltage to be supplied to a source electrode of a predetermined transistor included in each of the stages ST1, ST2, ST3, ST4, . . . . For example, the control voltage VON may be a constant voltage near a logic high level (gate-on voltage) of the first scan clock signal SCLK. In an embodiment, the control voltage VON may be the same as the scan clock signal SCLK or SCLKB. For example, each of the stages ST1, ST2, ST3, ST4, . . . may receive the same clock signal through the scan clock input terminal CK1 and the third input terminal IN3.

The fourth input terminal IN4 may receive a reset signal RESET. According to an embodiment, the first node N1 (refer to FIG. 4) of the stages ST1, ST2, ST3, ST4, . . . may simultaneously receive second power VSS2 by the reset signal RESET. As described above, by providing the scan start signal STV and the reset signal RESET through separate input terminals, the first stage ST1 need not be configured as a dummy stage.

The carry output terminal CR may output the carry signals CR[1], CR[2], CR[3], CR[4], . . . . The carry signals CR[1], CR[2], CR[3], CR[4], . . . may be provided to the first input terminal IN1 of the next stage.

The first output terminal OUT1 may output the scan signals SC[1], SC[2], SC[3], SC[4], . . . . The scan signals SC[1], SC[2], SC[3], SC[4], . . . may be supplied to the pixels PX through the corresponding scan lines SL1, SL2, SL3, SL4, . . . .

The second output terminal OUT2 may output the sensing signals SEN[1], SEN[2], SEN[3], SEN[4], . . . . The sensing signals SEN[1], SEN[2], SEN[3], SEN[4], . . . may be provided to the pixels PX through corresponding sensing control lines SSL1, SSL2, SSL3, SSL4, . . . .

The first power input terminal V1 may receive first power VSS1, and the second power input terminal V2 may receive the second power VSS2. The first power VSS1 and the second power VSS2 may be set to a gate-off voltage. In an embodiment, the first power VSS1 and the second power VSS2 may be the same. In addition, in an embodiment, a voltage level of the second power VSS2 may be less than a voltage level of the first power VSS1.

Hereinafter, a stage of a scan driver according to an embodiment is described with reference to FIG. 4.

Figure 4:
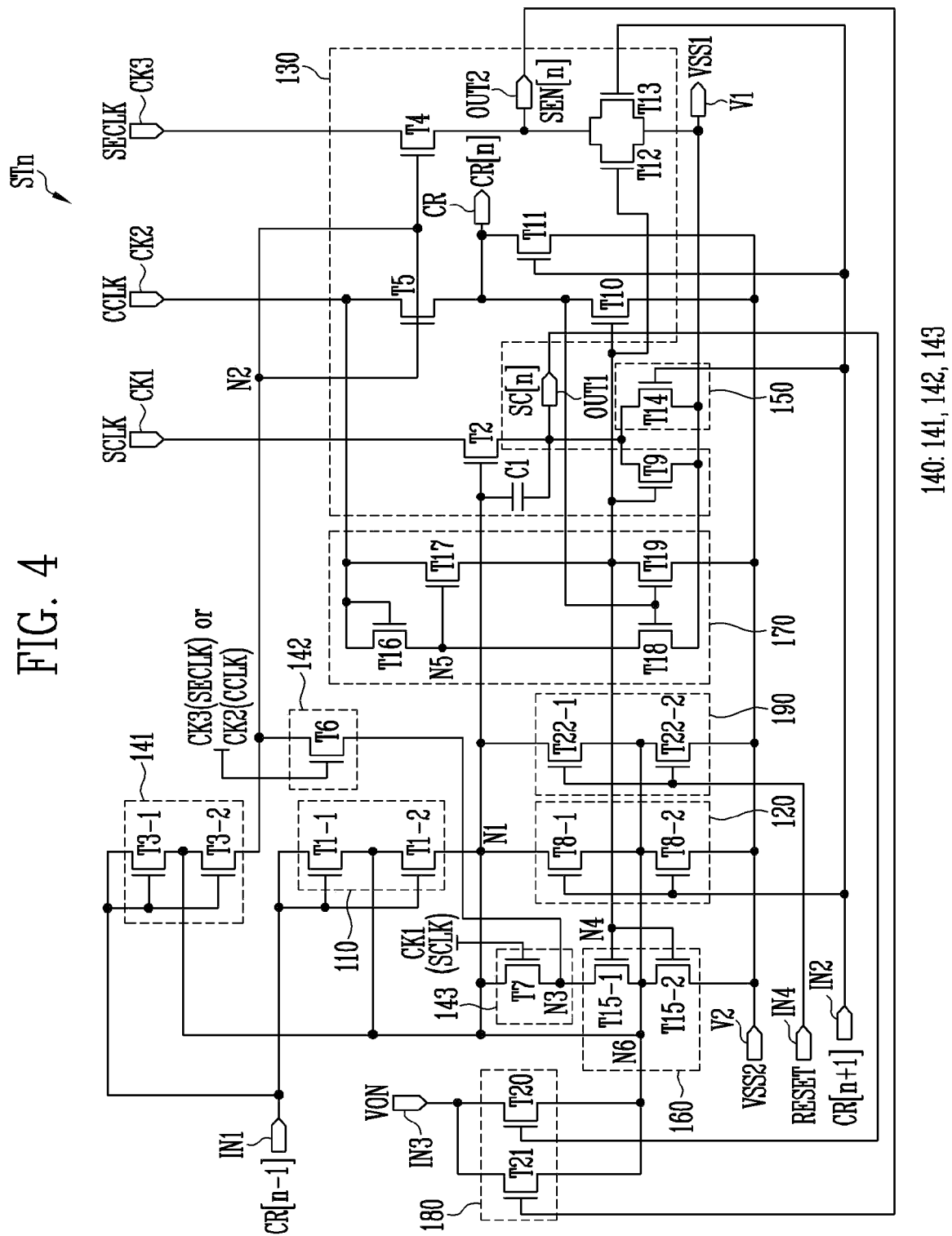
FIG. 4 is a circuit diagram illustrating an embodiment of a stage included in a scan driver of FIG. 1.
Figure 5:
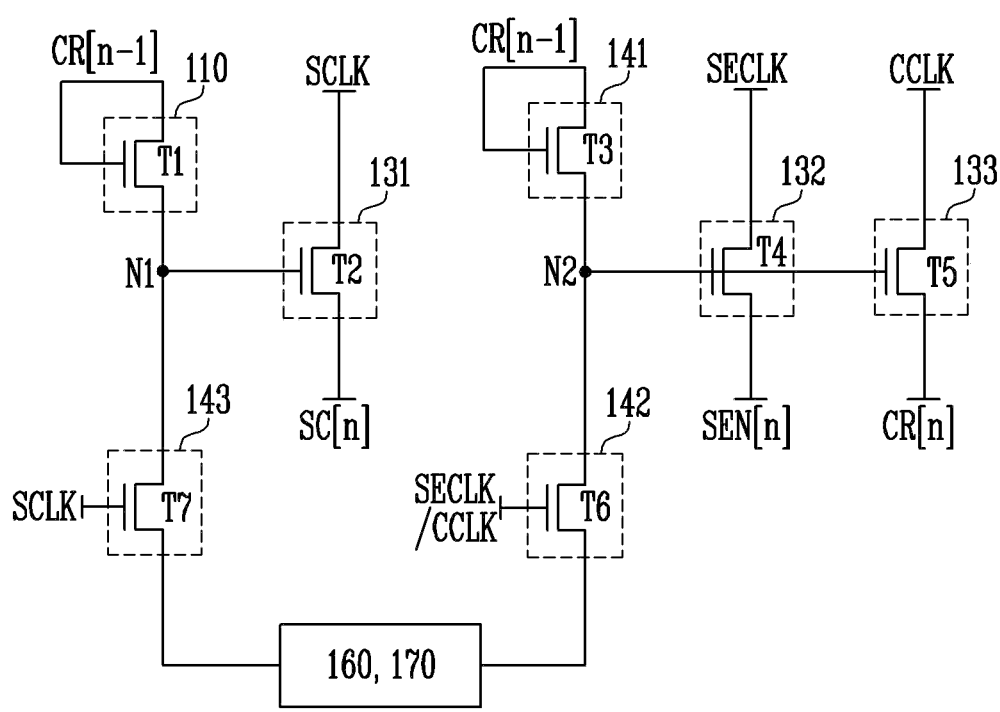
FIG. 5 is a diagram illustrating a portion of the circuit diagram of FIG. 4.

FIG. 4 is a circuit diagram illustrating an embodiment of a stage included in the scan driver of FIG. 1, and FIG. 5 is a diagram illustrating a portion of the circuit diagram of FIG. 4.

Referring to FIGS. 3 to 5, an n-th stage STn (n is a natural number) may include a first input unit 110 (e.g., a first input unit), a second input unit 120 (e.g., a second input unit), an output unit 130 (e.g., an output unit), a switching unit 140 (e.g., a switching unit), a first control unit 150 (e.g., a first control unit), a second control unit 160 (e.g., a second control unit), a third control unit 170 (e.g., a third control unit), a leakage control unit 180 (e.g., a leakage control unit), and a first reset unit 190 (e.g., a first reset unit).

In an embodiment, transistors included in the n-th stage STn are oxide semiconductor transistors. That is, a semiconductor layer of the transistors may be formed of an oxide semiconductor.

The first input unit 110 may control a voltage of the first node N1 in response to a carry signal CR[n−1] (the scan start signal STV (refer to FIG. 3), or an (n−1)-th carry signal) of the previous stage supplied to the first input terminal IN1. For example, the first input terminal IN1 receives the scan start signal STV as CR[n−1] when the first input unit 110 is part of the first stage ST1, and the first input terminal IN1 receives the (n−1) carry signal as CR[n−1] when the first input unit 110 is part of another stage (e.g., ST2). The voltage of the first node N1 is a voltage for controlling the output of the n-th scan signal SC[n]. For example, the voltage of the first node N1 is a voltage for controlling pull-up of the n-th scan signal SC[n].

On the other hand, the output of the n-th carry signal CR[n] and the n-th sensing signal SEN[n] may be controlled by a voltage of the second node N2.

In an embodiment, the first input unit 110 may provide a gate-on voltage (for example, a logic high level) of the (n−1)-th carry signal CR[n−1] (e.g., a previous carry signal) to the first node N1. For example, the first input unit 110 may precharge the voltage of the first node N1 by using the gate-on voltage of the (n−1)-th carry signal CR[n−1].

The first input unit 110 may include a first transistor T1 connected between the first input terminal IN1 and the first node N1. A gate electrode of the first transistor T1 may be connected to the first input terminal IN1. The first transistor T1 may include a (1-1)-th transistor T1-1 and a (1-2)-th T1-2 connected in series. A gate electrode of the (1-1)-th transistor T1-1 and a gate electrode of the (1-2)-th transistor T1-2 may be commonly connected to the first input terminal IN1. That is, the first transistor T1 may have a dual gate structure, and each of the (1-1)-th transistor T1-1 and the (1-2)-th transistor T1-2 may have a diode connection structure.

A common node between the (1-1)-th transistor T1-1 and the (1-2)-th transistor T1-2 (for example, a source electrode of the (1-1)-th transistor T1-1 and a drain electrode of the (1-2)-th transistor T1-2) may correspond to a sixth node N6. That is, the common node between the (1-1)-th transistor T1-1 and the (1-2)-th transistor T1-2 may be electrically connected to the sixth node N6.

The second input unit 120 may control the voltage of the first node N1 in response to the carry signal of the next stage (that is, an (n+1)-th carry signal CR[n+1]). In an embodiment, the second input unit 120 may provide a voltage of the second power VSS2 to the first node N1 in response to the (n+1)-th carry signal CR[n+1]. For example, the second input unit 120 may discharge the voltage of the first node N1 having a predetermined high potential voltage.

The second input unit 120 includes an eighth transistor connected between the first node N1 and the second power input terminal V2. A gate electrode of the eighth transistor may be connected to the second input terminal IN2. The eighth transistor may include a (8-1)-th transistor T8-1 and a (8-2)-th transistor T8-2 connected in series. A gate electrode of the (8-1)-th transistor T8-1 and a gate electrode of the (8-2)-th transistor T8-2 may be commonly connected to the second input terminal IN2. In an embodiment, the (8-1)-th transistor T8-1 and the (8-2)-th transistor T8-2 are replaced with a single eighth transistor.

A common node between the (8-1)-th transistor T8-1 and the (8-2)-th transistor T8-2 may be electrically connected to the sixth node N6. That is, the common node between the (8-1)-th transistor T8-1 and the (8-2)-th transistor T8-2 may correspond to the sixth node N6.

The output unit 130 may be connected to the scan clock input terminal CK1, the carry clock input terminal CK2, the sensing clock input terminal CK3, the first power input terminal V1, the second power input terminal V2, the first output terminal OUT1, the carry output terminal CR, and the second output terminal OUT2.

The output unit 130 may output the n-th scan signal SC[n] corresponding to the scan clock signal SCLK to the first output terminal OUT1 in response to the voltage of the first node N1. In an embodiment, the output unit 130 that outputs the n-th scan signal SC[n] may be referred to as a scan output unit 131. The scan output unit 131 may include a second transistor T2.

The output unit 130 may output the n-th sensing signal SEN[n] (e.g., a current sensing signal) corresponding to the sensing clock signal SECLK to the second output terminal OUT2 in response to the voltage of the second node N2. In an embodiment, the output unit 130 that outputs the n-th sensing signal SEN[n] may be referred to as a sensing output unit 132. The sensing output unit 132 may include a fourth transistor T4.

The output unit 130 may output the n-th carry signal CR[n] corresponding to the carry clock signal CCLK to the carry output terminal CR in response to the voltage of the second node N2. In an embodiment, the output unit 130 that outputs the n-th carry signal CR[n] (e.g., a current carry signal) may be referred to as a carry output unit 133. The carry output unit 133 may include a fifth transistor T5.

In an embodiment, a waveform of the n-th scan signal SC[n], a waveform of the n-th carry signal CR[n], and a waveform of the n-th sensing signal SEN[n] may be determined independently of each other according to the scan clock signal SCLK, the carry clock signal CCLK, and the sensing clock signal SECLK.

In an embodiment, the output unit 130 includes second, fourth, and fifth transistors T2, T4, and T5, and a first capacitor C1. In addition, the output unit 130 may further include ninth to thirteenth transistors T9 to T13.

The second transistor T2 may be connected between the scan clock input terminal CK1 and the first output terminal OUT1. A gate electrode of the second transistor T2 may be connected to the first node N1. The second transistor T2 may supply a gate-on voltage to the first output terminal OUT1 in response to the voltage of the first node N1. For example, the second transistor T2 may function as a pull-up buffer.

The first capacitor C1 may be connected between the first node N1 and the first output terminal OUT1. The first capacitor C1 may be a boosting capacitor. That is, the first capacitor C1 may bootstrap the voltage of the first node N1 in response to a voltage increase of the first output terminal OUT1, when the second transistor T2 is turned on. Accordingly, the second transistor T2 may stably maintain a turned-on state during a predetermined period.

The fourth transistor T4 may be connected between the sensing clock input terminal CK3 and the second output terminal OUT2. A gate electrode of the fourth transistor T4 may be connected to the second node N2. The fourth transistor T4 may supply a gate-on voltage to the second output terminal OUT2 in response to the voltage of the second node N2. For example, the fourth transistor T4 may function as a pull-up buffer.

The fifth transistor T5 may be connected between the carry clock input terminal CK2 and the carry output terminal CR. A gate electrode of the fifth transistor T5 may be connected to the second node N2. The fifth transistor T5 may supply the gate-on voltage to the carry output terminal CR in response to the voltage of the second node N2. For example, the fifth transistor T5 may function as a pull-up buffer.

The ninth transistor T9 may be connected between the first power input terminal V1 and the first output terminal OUT1. A gate electrode of the ninth transistor T9 may be connected to a fourth node N4. The ninth transistor T9 may supply a gate-off voltage to the first output terminal OUT1 in response to a voltage of the fourth node N4. For example, the ninth transistor T9 may hold a voltage of the first output terminal OUT1 as a gate-off voltage level (or a logic low level).

The tenth transistor T10 may be connected between the second power input terminal V2 and the carry output terminal CR. A gate electrode of the tenth transistor T10 may be connected to the fourth node N4. The tenth transistor T10 may supply a gate-off voltage to the carry output terminal CR in response to the voltage of the fourth node N4. For example, the tenth transistor T10 may hold a voltage of the carry output terminal CR as a gate-off voltage level (or a logic low level).

The eleventh transistor T11 may be connected between the second power input terminal V2 and the carry output terminal CR. A gate electrode of the eleventh transistor T11 may be connected to the second input terminal IN2. The eleventh transistor T11 may supply a gate-off voltage to the carry output terminal CR in response to the (n+1)-th carry signal CR[n+1] (e.g., a next carry signal).

The twelfth transistor T12 may be connected between the first power input terminal V1 and the second output terminal OUT2. A gate electrode of the twelfth transistor T12 may be connected to the fourth node N4. The twelfth transistor T12 may supply a gate-off voltage to the second output terminal OUT2 in response to the voltage of the fourth node N4. For example, the twelfth transistor T12 may hold a voltage of the second output terminal OUT2 as a gate-off voltage level (or a logic low level).

The thirteenth transistor T13 may be connected between the first power input terminal V1 and the second output terminal OUT2. A gate electrode of the thirteenth transistor T13 may be connected to the second input terminal IN2. The thirteenth transistor T13 may supply a gate-off voltage to the carry output terminal CR in response to the (n+1)-th carry signal CR[n+1].

The switching unit 140 may include a first switching unit 141, a second switching unit 142, and a third switching unit 143.

The first switching unit 141 may control the voltage of the second node N2 in response to the (n−1)-th carry signal CR[n−1].

In an embodiment, the first switching unit 141 may provide a gate-on voltage (for example, a logic high level) of the (n−1)-th carry signal CR[n−1] to the second node N2. For example, the first switching unit 141 may precharge the voltage of the second node N2 by using the gate-on voltage of the (n−1)-th carry signal CR[n−1].

The first switching unit 141 includes a third transistor T3 connected between the first input terminal IN1 and the second node N2. The third transistor T3 may include a (3-1)-th transistor T3-1 and a (3-2)-th transistor T3-2 connected in series. A gate electrode of the (3-1)-th transistor T3-1 and a gate electrode of the (3-2)-th transistor T3-2 may be commonly connected to the first input terminal IN1. That is, the third transistor T3 may have a dual gate structure, and each of the (3-1)-th transistor T3-1 and the (3-2)-th transistor T3-2 may have a diode connection structure.

A common node between the (3-1)-th transistor T3-1 and the (3-2)-th transistor T3-2 may correspond to the sixth node N6. That is, the common node between the (3-1)-th transistor T3-1 and the (3-2)-th transistor T3-2 may be electrically connected to the sixth node N6.

In an embodiment of the disclosure, the first switching unit 141 controls an electrical connection between the first input terminal IN1 and the second node N2. That is, the scan driver 100 (refer to FIG. 1) according to an embodiment includes the first switching unit 141 to allow the (n−1)-th carry signal CR[n−1] to be independently supplied to each of the first node N1 and the second node N2.

In other words, the (n−1)-th carry signal CR[n−1] may be supplied to the second node N2 using the first switching unit 141 and the (n−1)-th carry signal CR[n−1] may be supplied to the first node N1 using the first input unit 110.

The second switching unit 142 may control the voltage of the second node N2 in response to the sensing clock signal SECLK or the carry clock signal CCLK.

The second switching unit 142 may include a sixth transistor T6 connected between the second node N2 and the third node N3. A gate electrode of the sixth transistor T6 may be connected to the sensing clock input terminal CK3 or the carry clock input terminal CK2. For example, the sixth transistor T6 may supply a current corresponding to the voltage of the second node N2 to the third node N3 in response to the sensing clock signal SECLK. In addition, the sixth transistor T6 may supply the current corresponding to the voltage of the second node N2 to the third node N3 in response to the carry clock signal CCLK.

The second switching unit 142 may control an electrical connection between the second node N2 and the third node N3 (or the second control unit 160 and the third control unit 170 to be described later). According to an embodiment, the second node N2 and the third node N3 may be directly connected without the second switching unit 142.

The third switching unit 143 may control the voltage of the first node N1 in response to the scan clock signal SLCK.

The third switching unit 143 may include a seventh transistor T7 connected between the first node N1 and the third node N3. A gate electrode of the seventh transistor T7 may be connected to the scan clock input terminal CK1. The seventh transistor T7 may supply a current corresponding to the voltage of the first node N1 to the third node N3 in response to the scan clock signal SCLK.

The third switching unit 143 may control an electrical connection between the first node N1 and the third node N3 (or the second control unit 160 and the third control unit 170 to be described later). According to an embodiment, the first node N1 and the third node N3 may be directly connected without the third switching unit 143. For example, in an embodiment, the third switching unit 143 is omitted and the first node N1 is directly connected to the third node N3.

According to an embodiment, the switching unit 140 includes only the first switching unit 141 and the second switching unit 142 (i.e., 143 is omitted). In an embodiment, the switching unit 140 includes only the first switching unit 141 and the third switching unit 143 (i.e., 142 is omitted).

That is, in an embodiment, the stage STn includes the first switching unit 141 to separate the first node N1 and the second node N2, and may include the second switching unit 142 and the third switching unit 143 to control the electrical connection between the first node N1 or the second node N2 and the second and third control units 160 and 170. Specifically, the stage STn may include the second switching unit 142 to control the connection between the first node N1 and the second and third control units 160 and 170. In addition, the stage STn may include the third switching unit 143 to control the connection between the second node N2 and the second and third control units 160 and 170.

The second switching unit 142 may operate in response to the sensing clock signal SECLK or the carry clock signal CCLK, and the third switching unit 143 may operate in response to the scan clock signal SCLK. Therefore, the n-th scan signal SC[n] that may overlap the n-th sensing signal SEN[n] sequentially applied to the pixel row may be prevented from being output.

Accordingly, when the sensing signal for external compensation is applied, an unnecessary data voltage may be prevented from being applied to the pixel row by the scan signal.

The first controller 150 may control a voltage of the first output terminal OUT1 outputting the n-th scan signal SC[n] in response to the (n+1)-th carry signal CR[n+1].

The first controller 150 may include a fourteenth transistor T14 connected between the first power input terminal V1 and the first output terminal OUT1. A gate electrode of the fourteenth transistor T14 may be connected to the second input terminal IN2.

The first control unit 150 may provide a voltage of the first power VSS1 to the first output terminal OUT1 in response to the (n+1)-th carry signal CR[n+1]. For example, the fourteenth transistor T14 may discharge the voltage of the first output terminal OUT1 to the voltage of the first power VSS1.

The second control unit 160 may control a voltage of the third node N3 in response to a voltage of the fourth node N4. For example, the second controller 160 may provide the voltage of the second power VSS2 to the third node N3 in response to the voltage of the fourth node N4. That is, the second controller 160 may hold the voltage of the third node N3 as a predetermined gate-off voltage in response to the voltage of the fourth node N4.

The second control unit 160 may include a fifteenth transistor connected between the second power input terminal V2 and the third node N3. A gate electrode of the fifteenth transistor may be connected to the fourth node N4. The fifteenth transistor may include a (15-1)-th transistor T15-1 and a (15-2)-th transistor T15-2 connected in series. A gate electrode of the (15-1)-th transistor T15-1 and a gate electrode of the (15-2)-th transistor T15-2 may be commonly connected to the fourth node N4. In an embodiment, the (15-1)-th transistor T15-1 and a (15-2)-th transistor T15-2 are replaced with a single fifteenth transistor.

A common node between the (15-1)-th transistor T15-1 and the (15-2)-th transistor T15-2 may be electrically connected to the sixth node N6. That is, the common node between the (15-1)-th transistor T15-1 and the (15-2)-th transistor T15-2 may correspond to the sixth node N6.

The third controller 170 may control the voltage of the fourth node N4 in response to the carry clock signal CCLK and the n-th carry signal CR[n]. In an embodiment, the third control unit 170 may transmit the scan clock signal SCLK to the fourth node N4 in response to the carry clock signal CCLK and then supply a gate-off voltage to the fourth node N4 in response to the n-th carry signal CR[n].

The third control unit 170 may include sixteenth to nineteenth transistors T16 to T19.

The sixteenth transistor T16 may be connected between the carry clock input terminal CK2 and a fifth node N5. A gate electrode of the sixteenth transistor T16 may be connected to the carry clock input terminal CK2.

The seventeenth transistor T17 may be connected between the carry clock input terminal CK2 and the fourth node N4. A gate electrode of the seventeenth transistor T17 may be connected to the fifth node N5.

The eighteenth transistor T18 may be connected between the first power input terminal V1 and the fifth node N5. A gate electrode of the eighteenth transistor T18 may be connected to the carry output terminal CR.

The nineteenth transistor T19 may be connected between the second power input terminal V2 and the fourth node N4. A gate electrode of the nineteenth transistor T19 may be connected to the carry output terminal CR.

That is, when the n-th carry signal CR[n] is output (or when the n-th carry signal CR[n] has a gate-on voltage), the eighteenth transistor T18 may be turned on and thus the seventeenth transistor T17 may be turned off, and the nineteenth transistor T19 may be turned on and thus the voltage of the second power VSS2 may be supplied to the fourth node N4. Therefore, when the n-th carry signal CR[n] is output, the fourth node N4 may have a gate-off voltage.

The leakage controller 180 may supply the control voltage VON supplied to the third input terminal IN3 in response to one of the n-th scan signal SC[n] and the n-th sensing signal SEN[n] to the first input unit 110, the second input unit 120, the first switching unit 141, and the second control unit 160.

The leakage controller 180 may include a twentieth transistor T20 and a twenty-first transistor T21 connected between the third input terminal IN3 and the sixth node N6. A gate electrode of the twentieth transistor T20 may be connected to the first output terminal OUT1. A gate electrode of the twenty-first transistor T21 may be connected to the second output terminal OUT2.

The twentieth transistor T20 may supply the control voltage VON to the sixth node N6 in response to the n-th scan signal SC[n]. The twenty-first transistor T21 may supply the control voltage VON to the sixth node N6 in response to the n-th sensing signal SEN[n]. Accordingly, when at least one of the n-th scan signal SC[n] and the n-th sensing signal SEN[n] has a gate-on voltage, the control voltage VON may be supplied to the sixth node N6. Therefore, the voltage of the first node N1 may be maintained without current leakage during a scan on time (sensing on time).

The first reset unit 190 may control the voltage of the first node N1 in response to the reset signal RESET.

The first reset unit 190 may include a twenty-second transistor connected between the second power input terminal V2 and the first node N1. A gate electrode of the twenty-second transistor may be connected to the fourth input terminal IN4. The twenty-second transistor may include a (22-1)-th transistor T22-1 and a (22-2)-th transistor T22-2 connected in series. A gate electrode of the (22-1)-th transistor T22-1 and a gate electrode of the (22-2)-th transistor T22-2 may be commonly connected to the fourth input terminal IN4. In an embodiment, the (22-1)-th transistor T22-1 and a (22-2)-th transistor T22-2 are replaced with a single twenty-second transistor.

A common node between the (22-1)-th transistor T22-1 and the (22-2)-th transistor T22-2 may be electrically connected to the sixth node N6. That is, the common node between the (22-1)-th transistor T22-1 and the (22-2)-th transistor T22-2 may correspond to the sixth node N6.

When the reset signal RESET is output, the (22-1)-th transistor T22-1 and the (22-2)-th transistor T22-2 may be turned on, and thus the voltage of the second power VSS2 may be supplied to the first node N1. Therefore, when the reset signal RESET is output, the first node N1 may have a gate-off voltage.

Hereinafter, an operation of a display device including a scan driver according to an embodiment is described with reference to FIG. 6.

Figure 6:
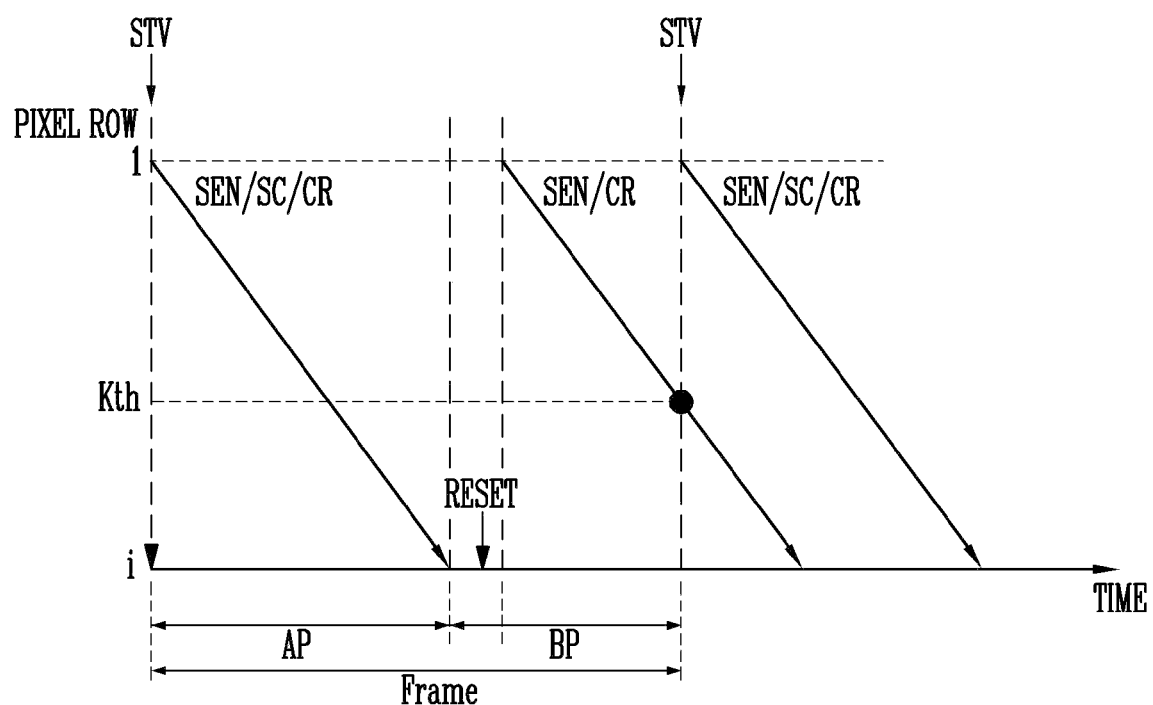
FIG. 6 is a diagram illustrating a timing of a signal applied to a pixel unit according to an embodiment.

FIG. 6 is a diagram illustrating a timing of a signal applied to a pixel unit according to an embodiment. According to an embodiment, the scan start signal STV may be supplied to the stage STn (refer to FIG. 4) at every start time point of a frame (or a frame period).

Referring to FIGS. 1 to 6, one frame (or frame period) displaying an image may include an active period AP and a blank period BP.

The active period AP may be a period in which the pixel PX displays an image corresponding to the data signal. In an embodiment, the scan clock signal SCLK, the carry clock signal CCLK, and the sensing clock signal SECLK are output at the same timing during the active period AP. Accordingly, the n-th scan signal SC[n], the n-th carry signal CR[n], and the n-th sensing signal SEN[n] may simultaneously have a gate-on voltage. In an embodiment, pulses of the n-th scan signal SC[n], the n-th carry signal CR[n], and the n-th sensing signal SEN[n] representing the gate-on voltage transition from a first voltage to a second voltage at a first time, maintain the second voltage until a second time after the first time, and transition from the second voltage to the first voltage at a third time after the second time, during the active period AP. During the active period AP, the scan signal SC, the carry signal CR, and the sensing signal SEN may be sequentially supplied to the pixel rows.

The blank period BP may include a sensing period in which a sensing value is extracted from the pixel PX through the sensing line RLm. In an embodiment, a characteristic such as the mobility of the first pixel transistor TR1 may be detected during the blank period BP. However, this is an example, and a threshold voltage change amount of the first pixel transistor TR1 and/or a characteristic change of the light emitting element LD may be detected during the sensing period. For example, since a sensing operation is performed on only one pixel row during the blank period BP, the carry signal may not be output. Therefore, the carry clock signal CCLK and the n-th carry signal CR[n] may maintain a gate-off voltage.

Timings of the scan clock signal SCLK, the carry clock signal CCLK, and the sensing clock signal SECLK may be different from each other during the blank period BP.

The reset signal RESET may be applied during the blank period BP, and thus the first node N1 of the stage STn on which the sensing operation is performed may be reset in a predetermined period.

After the reset signal RESET is applied, the sensing signal SEN and/or the carry signal CR may be sequentially supplied from a first pixel row to an i-th pixel row in the pixel unit 200 described with reference to FIG. 1. As the sensing signal SEN is supplied, the third pixel transistor TR3 of the pixel unit 200 may provide the initialization voltage Vint to the eleventh node N11 and initialize the first electrode of the light emitting element LD. At this time, the first pixel transistor TR1 may not be turned on by the initialization voltage Vint of the eleventh node N11. For example, the threshold voltage of the first pixel transistor TR1 may not be reached by the initialization voltage Vint of the eleventh node N11. Accordingly, the light emitting element LD may be in a non-emission state.

For example, a case where the sensing signal SEN is supplied from a K-th pixel row Kth, the first electrode of the light emitting element LD is initialized, and when the light emitting element LD is in the non-emission state, a scan signal SC is applied by the scan start signal STV is described.

In the scan driver 100 according to an embodiment, a gate electrode of each transistor for outputting the scan signal SC and the sensing signal SEN is connected to a separate node. Therefore, the initialization voltage Vint may be applied by the sensing signal SEN even after the K-th pixel row Kth, and thus the light emitting element LD may maintain the non-emission state. That is, the scan driver according to an embodiment may connect the gate electrode of each transistor for outputting the scan signal SC and the sensing signal SEN to a separate node. Therefore, a case where each signal is dependent on each other and may be supplied to the pixel PX as the scan signal SC is applied after the sensing signal SEN may be prevented.

Therefore, according to an embodiment, when the sensing signal SEN for external compensation is applied, an unnecessary data voltage may be prevented from being applied to the pixel row by the scan signal SC.

In addition, according to an embodiment, by connecting the gate electrode of each transistor for outputting the scan signal SC and the sensing signal SEN to a separate node, a non-emission time may be maintained constant regardless of a frequency fluctuation, after reset.

Hereinafter, a voltage change at each node of the stage described with reference to FIGS. 4 to 6 is described with reference to FIG. 7.

Figure 7:
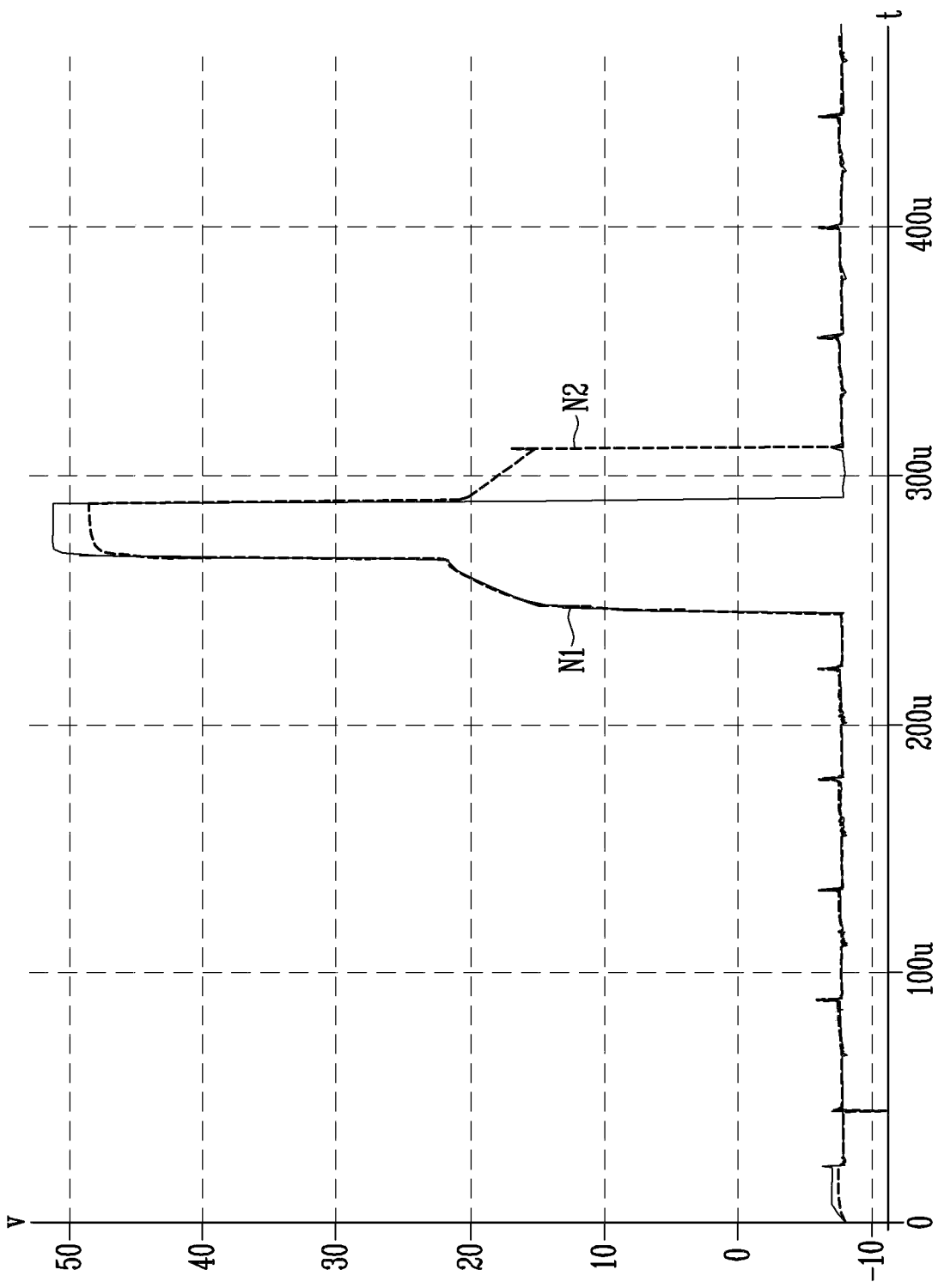
FIG. 7 is a graph illustrating a voltage change of a first node and a second node of a scan driver according to an embodiment.

FIG. 7 is a graph illustrating a voltage change of a first node and a second node of a scan driver according to an embodiment. Hereinafter, description is n-th with reference to FIGS. 1 to 6 together.

Referring to FIG. 7, a change of a voltage over time at the first node N1 and the second node N2 of the stage STn is shown.

The stage STn according to an embodiment may output the n-th scan signal SC[n] in response to the voltage of the first node N1, and output the n-th carry signal CR[n] and the n-th sensing signal SEN[n] in response to the voltage of the second node N2.

The voltage of the first node N1 may be precharged by the (n−1)-th carry signal CR[n−1] through the first input unit 110. The voltage of the first node N1 may be discharged by the (n+1)-th carry signal CR[n+1] through the second input unit 120.

The voltage of the second node N2 may be precharged through the first switching unit 141. However, since the second node N2 is not electrically connected to the second input terminal IN2, the second node N2 is not discharged by the (n+1)-th carry signal CR[n+1].

Therefore, according to the voltage change of the first node N1 and the second node N2, the scan driver 100 (refer to FIG. 1) according to an embodiment connects the gate electrode of each transistor for outputting the scan signal and the sensing signal to a separate node.

Hereinafter, an embodiment of a stage included in the scan driver is described with reference to FIG. 8.

Figure 8:
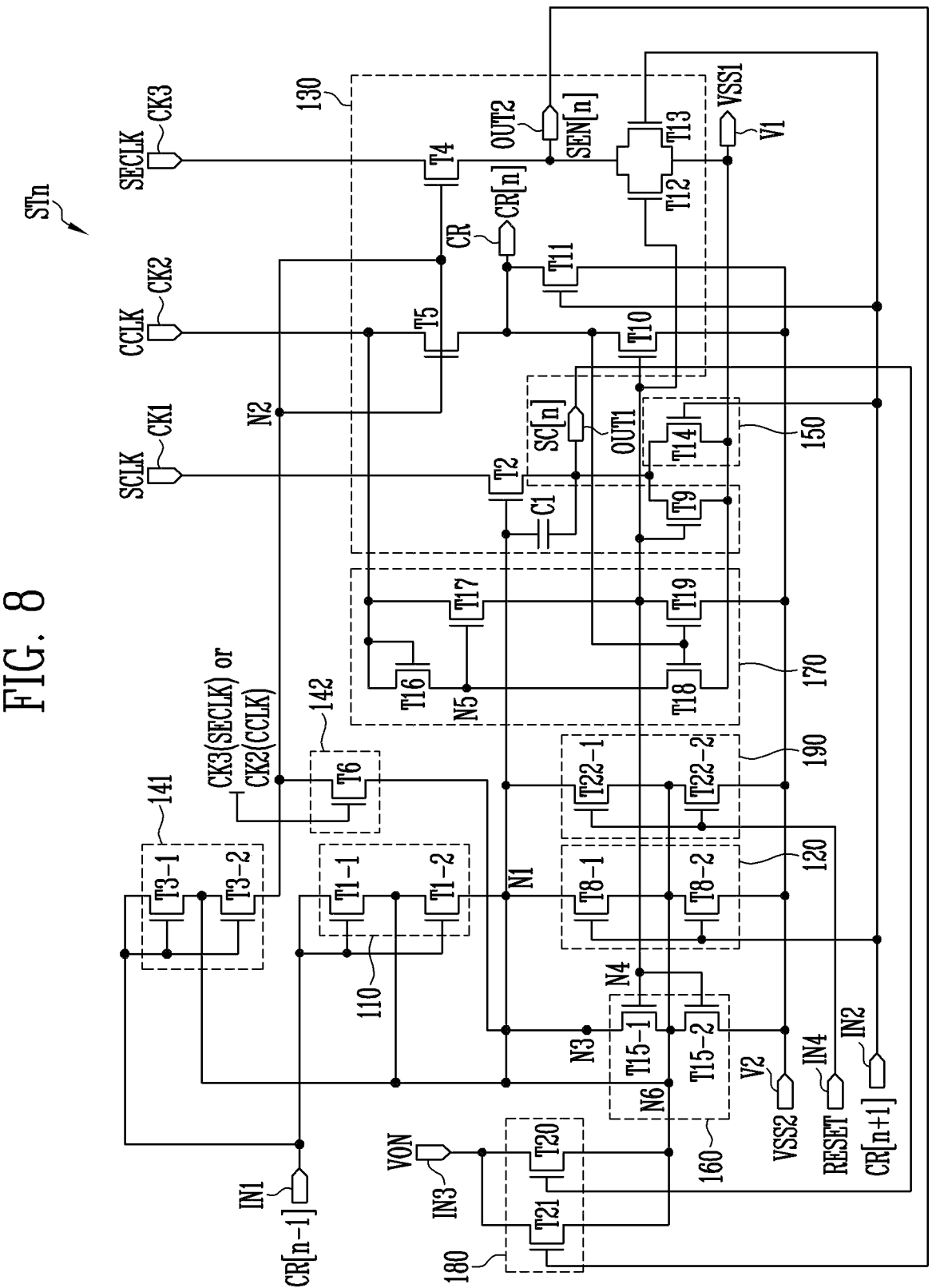
FIG. 8 is a circuit diagram illustrating an embodiment of the stage included in the scan driver of FIG. 1.

FIG. 8 is a circuit diagram illustrating an embodiment of the stage included in the scan driver of FIG. 1. The circuit diagram shown in FIG. 8 is similar to that shown in FIG. 4. Therefore, hereinafter, differences are mainly described in order to avoid repetitive descriptions.

Referring to FIG. 8, the n-th stage STn (n is a natural number) may include the first input unit 110, the second input unit 120, the output unit 130, the first switching unit 141, the second switching unit 142, the first control unit 150, the second control unit 160, the third control unit 170, the leakage control unit 180, and the first reset unit 190.

In the n-th stage STn shown in FIG. 8, the third switching unit 143 is removed as compared to the n-th stage STn shown in FIG. 4. Accordingly, the second control unit 160 is directly connected to the first node N1.

The first switching unit 141 may control the voltage of the second node N2 in response to the (n−1)-th carry signal CR[n−1].

In an embodiment, the first switching unit 141 may provide the gate-on voltage (for example, a logic high level) of the (n−1)-th carry signal CR[n−1] to the second node N2. For example, the first switching unit 141 may precharge the voltage of the second node N2 by using the gate-on voltage of the (n−1)-th carry signal CR[n−1].

The first switching unit 141 includes the third transistor T3 connected between the first input terminal IN1 and the second node N2. The third transistor T3 may include the (3-1)-th transistor T3-1 and the (3-2)-th transistor T3-2 connected in series. The gate electrode of the (3-1)-th transistor T3-1 and the gate electrode of the (3-2)-th transistor T3-2 may be commonly connected to the first input terminal IN1. That is, the third transistor T3 may have a dual gate structure, and each of the (3-1)-th transistor T3-1 and the (3-2)-th transistor T3-2 may have a diode connection structure.

The first switching unit 141 may control the electrical connection between the first input terminal IN1 and the second node N2. That is, the scan driver 100 (refer to FIG. 1) according to an embodiment may include the first switching unit 141 to allow the (n−1)-th carry signal CR[n−1] to be independently supplied to each of the first node N1 and the second node N2.

The second switching unit 142 may control the voltage of the second node N2 in response to the sensing clock signal SECLK or the carry clock signal CCLK.

The second switching unit 142 may include the sixth transistor T6 connected between the second node N2 and the third node N3. The gate electrode of the sixth transistor T6 may be connected to the sensing clock input terminal CK3 or the carry clock input terminal CK2.

For example, the sixth transistor T6 may supply the current corresponding to the voltage of the second node N2 to the third node N3 in response to the sensing clock signal SECLK. In addition, the sixth transistor T6 may supply the current corresponding to the voltage of the second node N2 to the third node N3 in response to the carry clock signal CCLK.

In an embodiment, the stage STn may include the first switching unit 141 to separate the first node N1 and the second node N2, and may include the second switching unit 142 to control the electrical connection between the second node N2 and the second and third control units 160 and 170.

Hereinafter, a voltage change at each node of the stage described with reference to FIG. 8 is described with reference to FIG. 9.

Figure 9:
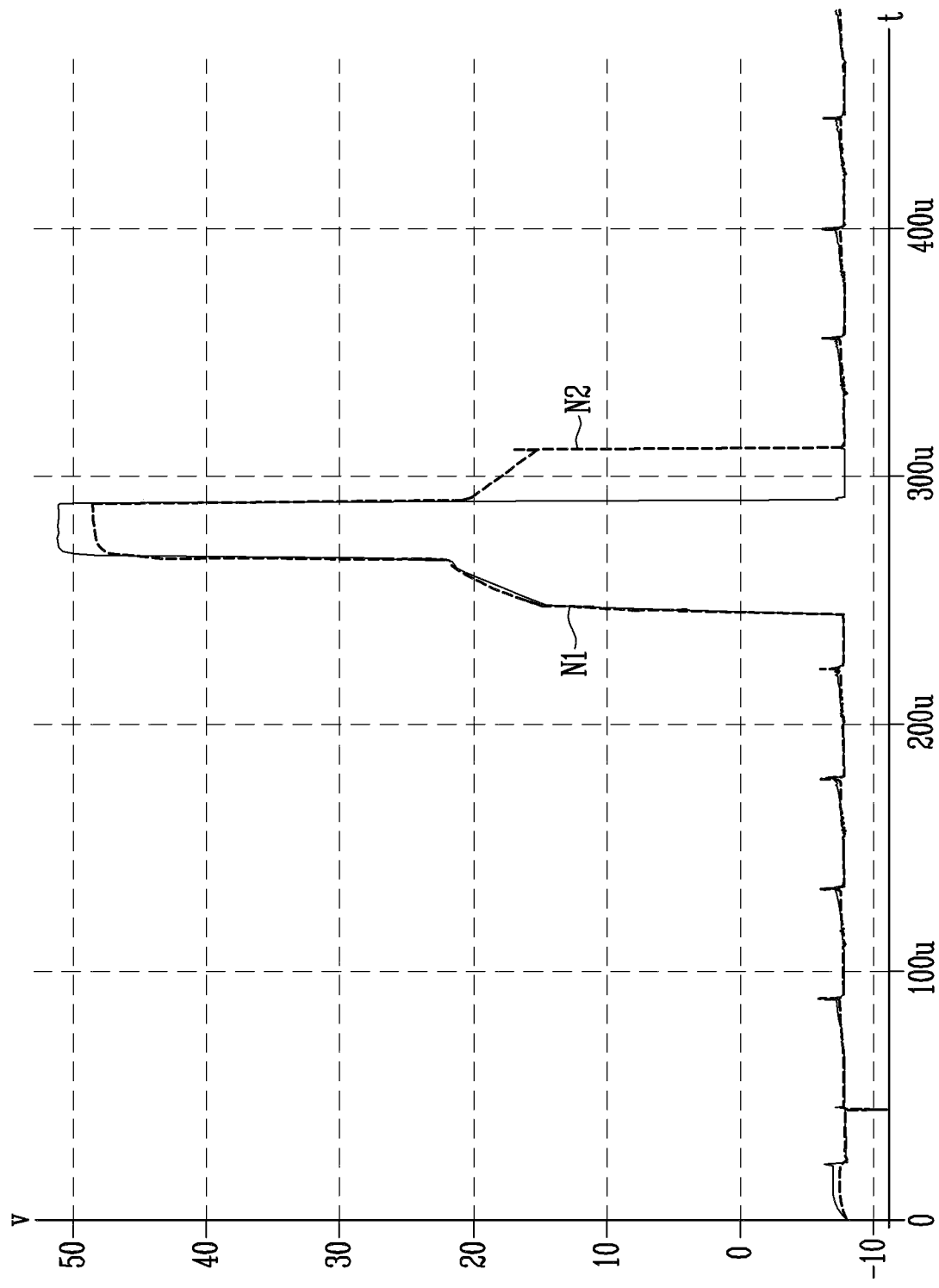
FIG. 9 is a graph illustrating a voltage change of a first node and a second node of a scan driver according to an embodiment.

FIG. 9 is a graph illustrating a voltage change of a first node and a second node of a scan driver according to an embodiment.

Referring to FIG. 9, a change of a voltage over time at the first node N1 and the second node N2 of the stage STn is shown.

The stage STn according to an embodiment may output the n-th scan signal SC[n] in response to the voltage of the first node N1, and output the n-th carry signal CR[n] and the n-th sensing signal SEN[n] in response to the voltage of the second node N2.

The voltage of the first node N1 may be precharged by the (n−1)-th carry signal CR[n−1] through the first input unit 110. The voltage of the first node N1 may be discharged by the (n+1)-th carry signal CR[n+1] through the second input unit 120.

The voltage of the second node N2 may be precharged through the first switching unit 141. However, since the second node N2 is not electrically connected to the second input terminal IN2, the second node N2 is not discharged by the (n+1)-th carry signal CR[n+1].

Hereinafter, an embodiment of a stage included in a scan driver is described with reference to FIG. 10.

Figure 10:
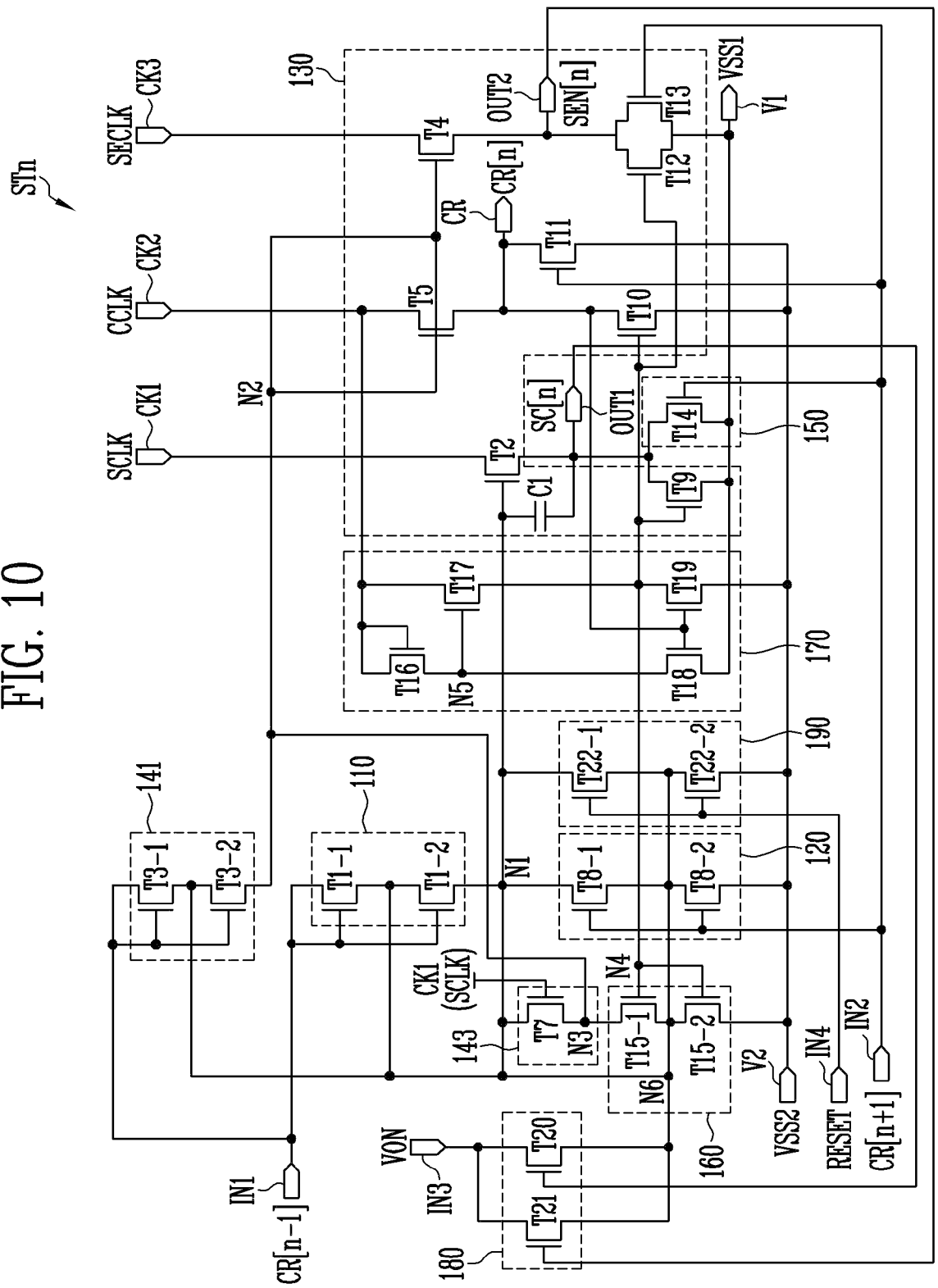
FIG. 10 is a circuit diagram illustrating an embodiment of the stage included in the scan driver of FIG. 1.

FIG. 10 is a circuit diagram illustrating an embodiment of the stage included in the scan driver of FIG. 1. The circuit diagram shown in FIG. 10 is similar to that shown in FIG. 4. Therefore, hereinafter, differences are mainly described in order to avoid repetitive descriptions.

Referring to FIG. 10, the n-th stage STn (n is a natural number) may include the first input unit 110, the second input unit 120, the output unit 130, the first switching unit 141, the third switching unit 143, the first control unit 150, the second control unit 160, the third control unit 170, the leakage control unit 180, and the first reset unit 190.

In the n-th stage STn shown in FIG. 10, the second switching unit 142 is removed as compared to the n-th stage STn shown in FIG. 4. Accordingly, the second control unit 160 is directly connected to the second node N2.

The first switching unit 141 may control the voltage of the second node N2 in response to the (n−1)-th carry signal CR[n−1].

In an embodiment, the first switching unit 141 may provide the gate-on voltage (for example, a logic high level) of the (n−1)-th carry signal CR[n−1] to the second node N2. For example, the first switching unit 141 may precharge the voltage of the second node N2 by using the gate-on voltage of the (n−1)-th carry signal CR[n−1].

The third switching unit 143 may control the current corresponding to the voltage of the first node N1 in response to the scan clock signal SLCK.

The third switching unit 143 may include the seventh transistor T7 connected between the first node N1 and the third node N3. The gate electrode of the seventh transistor T7 may be connected to the scan clock input terminal CK1. The seventh transistor T7 may supply the current corresponding to the voltage of the first node N1 to the third node N3 in response to the scan clock signal SCLK.

The third switching unit 143 may control the electrical connection between the first node N1 and the third node N3 (or the second control unit 160 and the third control unit 170 to be described later).

That is, in an embodiment, the stage STn may include the first switching unit 141 to separate the first node N1 and the second node N2, and may include the third switching unit 143 to control the electrical connection between the first node N1 and the second and third control units 160 and 170.

Hereinafter, an embodiment of a stage included in the scan driver is described with reference to FIG. 11.

Figure 11:
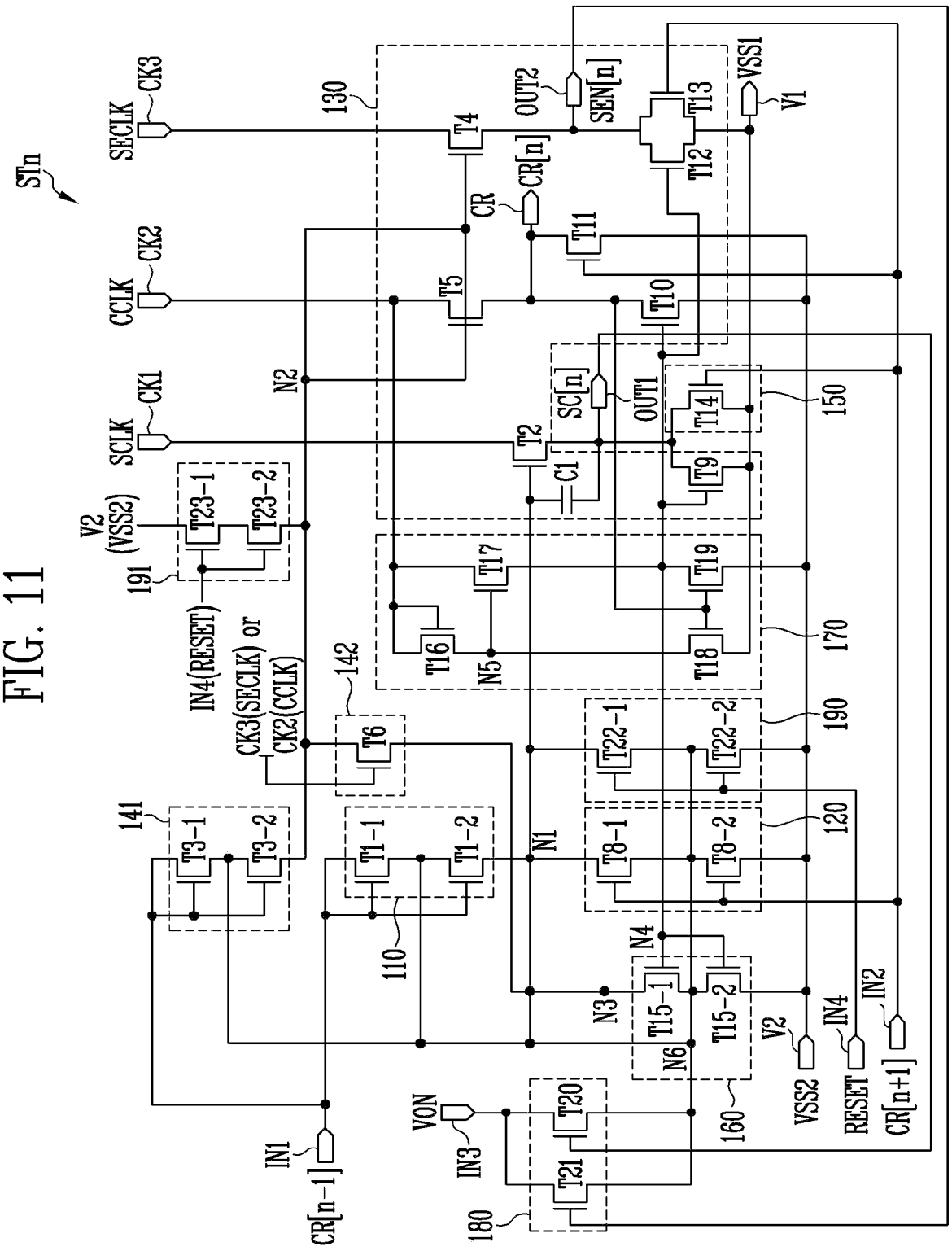
FIG. 11 is a circuit diagram illustrating an embodiment of the stage included in the scan driver of FIG. 1.

FIG. 11 is a circuit diagram illustrating an embodiment of the stage included in the scan driver of FIG. 1. The circuit diagram shown in FIG. 11 is similar to that shown in FIG. 8. Therefore, hereinafter, differences are mainly described in order to avoid repetitive descriptions.

Referring to FIG. 11, the n-th stage STn (n is a natural number) may include the first input unit 110, the second input unit 120, the output unit 130, the first switching unit 141, the second switching unit 142, the first control unit 150, the second control unit 160, the third control unit 170, the leakage control unit 180, the first reset unit 190, and a second reset unit 191.

The n-th stage STn shown in FIG. 11 may further include the second reset unit 191 as compared to the n-th stage STn shown in FIG. 8. Accordingly, the second node N2 may be reset by the second reset unit 191.

The first switching unit 141 may control the voltage of the second node N2 in response to the (n−1)-th carry signal CR[n−1].

In an embodiment, the first switching unit 141 may provide a gate-on voltage (for example, a logic high level) of the (n−1)-th carry signal CR[n−1] to the second node N2. For example, the first switching unit 141 may precharge the voltage of the second node N2 by using the gate-on voltage of the (n−1)-th carry signal CR[n−1].

The first switching unit 141 may include the (3-1)-th transistor T3-1 and the (3-2)-th transistor T3-2 connected in series between the first input terminal IN1 and the second node N2.

The first switching unit 141 may control the electrical connection between the first input terminal IN1 and the second node N2. That is, the scan driver 100 (refer to FIG. 1) according to an embodiment may include the first switching unit 141 to allow the (n−1)-th carry signal CR[n−1] to be independently supplied to each of the first node N1 and the second node N2.

The second switching unit 142 may control a current corresponding to the voltage of the second node N2 in response to the sensing clock signal SECLK or the carry clock signal CCLK.

The second switching unit 142 may include the sixth transistor T6 connected between the second node N2 and the third node N3. The gate electrode of the sixth transistor T6 may be connected to the sensing clock input terminal CK3 or the carry clock input terminal CK2.

In an embodiment, the stage STn may include the first switching unit 141 to separate the first node N1 and the second node N2, and may include the second switching unit 142 to control the electrical connection between the second node N2 and the control units 160 and 170.

The first reset unit 190 may control the voltage of the first node N1 in response to the reset signal RESET.

The first reset unit 190 may include the (22-1)-th transistor T22-1 and the (22-2)-th transistor T22-2 connected in series between the second power input terminal V2 and the first node N1. The gate electrode of the (22-1)-th transistor T22-1 and the gate electrode of the (22-2)-th transistor T22-2 may be commonly connected to the fourth input terminal IN4.

When the reset signal RESET is output, the (22-1)-th transistor T22-1 and the (22-2)-th transistor T22-2 may be turned on, and thus the voltage of the second power VSS2 may be supplied to the first node N1. Therefore, when the reset signal RESET is output, the first node N1 may have a gate-off voltage.

The second reset unit 191 may control the voltage of the second node N2 in response to the reset signal RESET supplied to the fourth input terminal IN4.

The second reset unit 191 may include a twenty-third transistor connected between the second power input terminal V2 and the second node N2. The twenty-third transistor may include a (23-1)-th transistor T23-1 and a (23-2)-th transistor T23-2 connected in series. A gate electrode of the (23-1)-th transistor T23-1 and a gate electrode of the (23-2)-th transistor T23-2 may be commonly connected to the fourth input terminal IN4. In an embodiment, the (23-1)-th transistor T23-1 and a (23-2)-th transistor T23-2 are replaced with a single twenty-third transistor.

When the reset signal RESET is output, the (23-1)-th transistor T23-1 and the (23-2)-th transistor T23-2 may be turned on, and thus the voltage of the second power VSS2 may be supplied to the second node N2. Therefore, when the reset signal RESET is output, the second node N2 may have a gate-off voltage.

Hereinafter, a method of driving the display device according to an embodiment of the disclosure is described with reference to FIG. 12.

Figure 12:
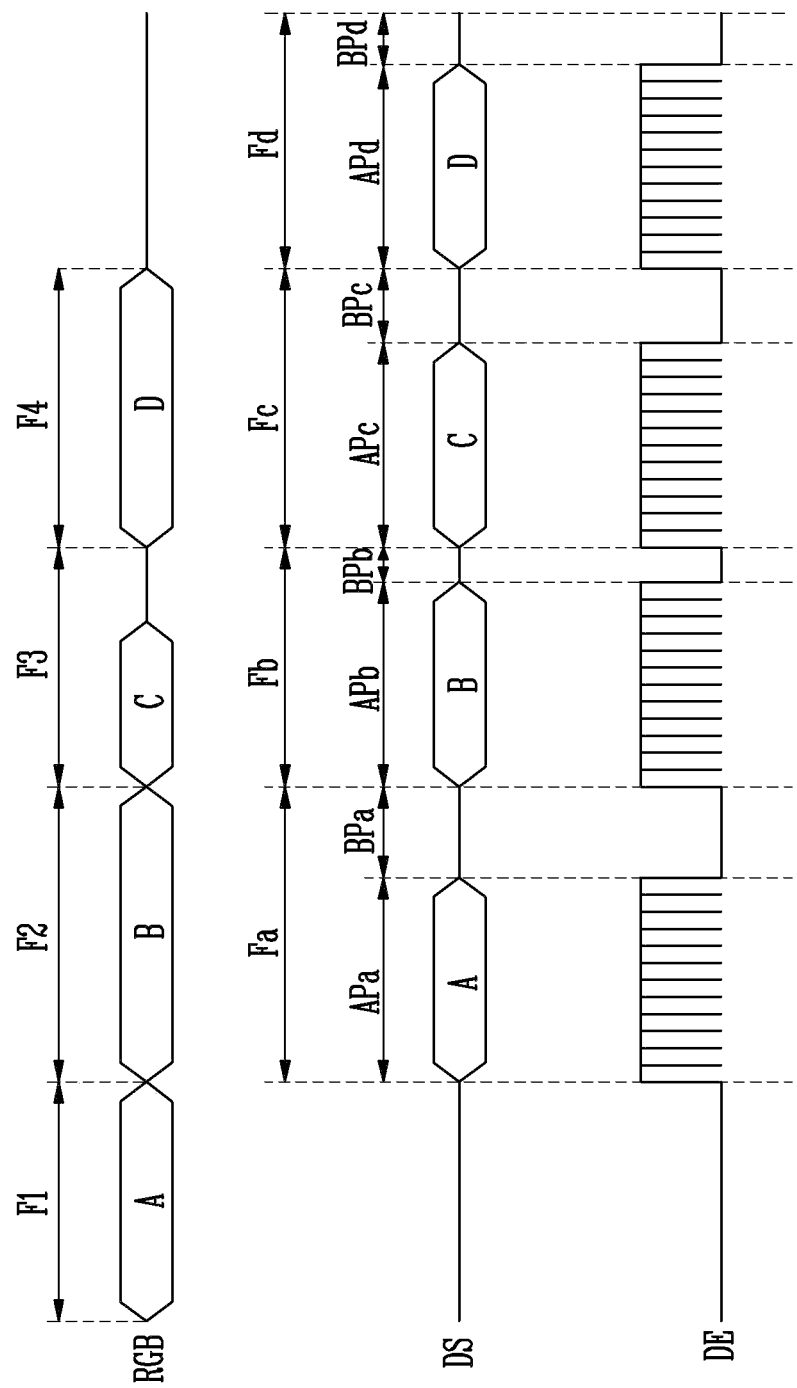
FIG. 12 is a diagram illustrating an example of driving a display device according to an image signal supplied from an outside.

FIG. 12 is a diagram illustrating an example of driving a display device according to an image signal supplied from the outside.

Referring to FIG. 12 and the above-described FIGS. 1 and 6, the image signal RGB supplied from the outside may be a signal rendered by a graphic processor or the like. A frame rate of the image signal RGB may be changed according to a rendering time of the graphic processor.

In the following description, the frame rate means a frame frequency, that is, the number of frames transmitted per second (frame per second). The larger the frame rate, the shorter a time length and a blank period of one frame (or one frame period), and the smaller the frame rate, the longer the time length and the blank period of one frame (or one frame period).

In an embodiment, when the frame rate of the image signal RGB is changed according to the rendering time of the graphic processor, the frame rate of the display device may also be changed.

The image signal RGB may be output as the data signal DS or (the data voltage) after being signal-processed by the timing controller 400 and delayed by one frame (or one frame period). In an embodiment, the data signal DS may be output based on a data enable signal DE supplied from the timing controller 400.

The frame rate of the display device is the same as a frame rate of a frame delayed by one frame of the image signal RGB received from the outside.

For example, a frame rate of a frame Fa at which an "A" data signal DS of the display device is output may be the same as a frame rate of a frame F2 at which a "B" image signal RGB is received. A frame rate of a frame Fb at which a "B" data signal DS of the display device is output may be the same as a frame rate of a frame F3 at which a "C" image signal RGB is received.

One frame (or frame period) of the display device may include an active period in which the data signal DS is output and a blank period. A time length of active periods APa, APb, APc, and APd in which data signals DS "A", "B", "C" and "D" are output in each of frames Fa, Fb, Fc, and Fd may be equal to each other.

In an embodiment, each of the active periods APa, APb, APc, and APd include a scan period in which the data signal DS is written to the pixel PX (refer to FIG. 2).

In an embodiment, a time length of blank periods BPa, BPb, BPc, and BPd vary according to a frame rate of each of the frames Fa, Fb, Fc, and Fd and a difference of the active periods APa, APb, APc, and APd.

In the display device, even though the frame rate is irregularly changed, the length of the blank periods BPa, BPb, BPc, and BPd of each of the frames Fa, Fb, Fc, and Fd may be controlled. Therefore, image tearing due to a discrepancy between frame generation of the graphic processor and a frame output of the display device, and input lag in which a portion of an input frame disappears may be reduced.

However, a luminance change or a flicker may be recognized due to a change of the blank period according to a change of the frame rate. Therefore, a driving method for increasing image quality may be needed in driving including the pixel structure of FIG. 2 and the pixel driving of FIG. 6 (for example, referred to as free-sync driving or G-sync driving) described above.

In an embodiment, when the display device is driven at a frame rate lower than a maximum frame rate set to the display device, an additional light-emitting-off period is inserted into the blank period BP to reduce luminance deviation according to a frequency difference of a data writing period.

That is, according to an embodiment, when the sensing signal for external compensation is applied, an unnecessary data voltage may be prevented from being applied to the pixel row by the scan signal.

Hereinafter, an embodiment of the stage included in the scan driver is described with reference to FIGS. 13 and 14.

Figure 13:
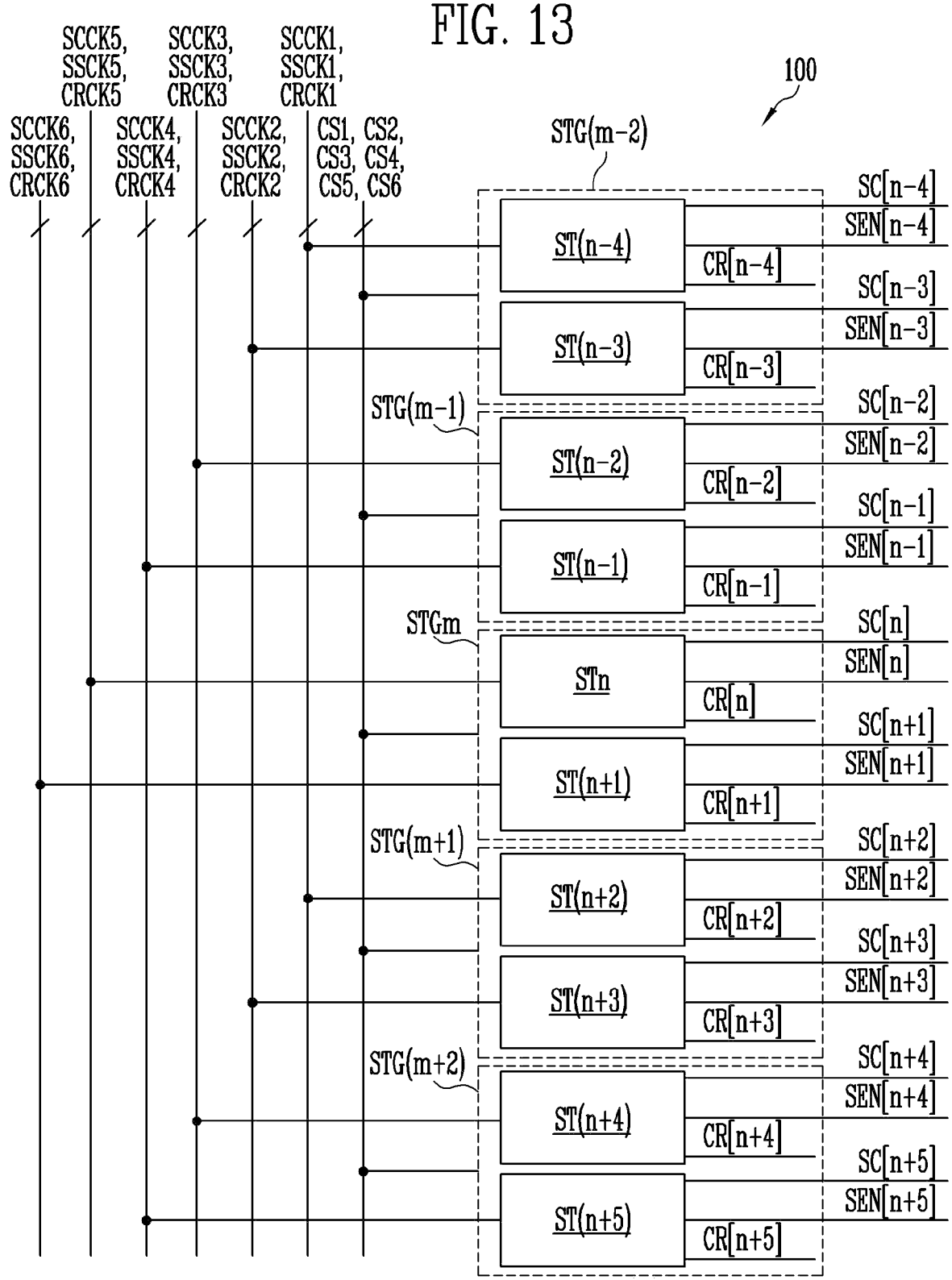
FIG. 13 is a circuit diagram illustrating a scan driver according to an embodiment.
Figure 14:
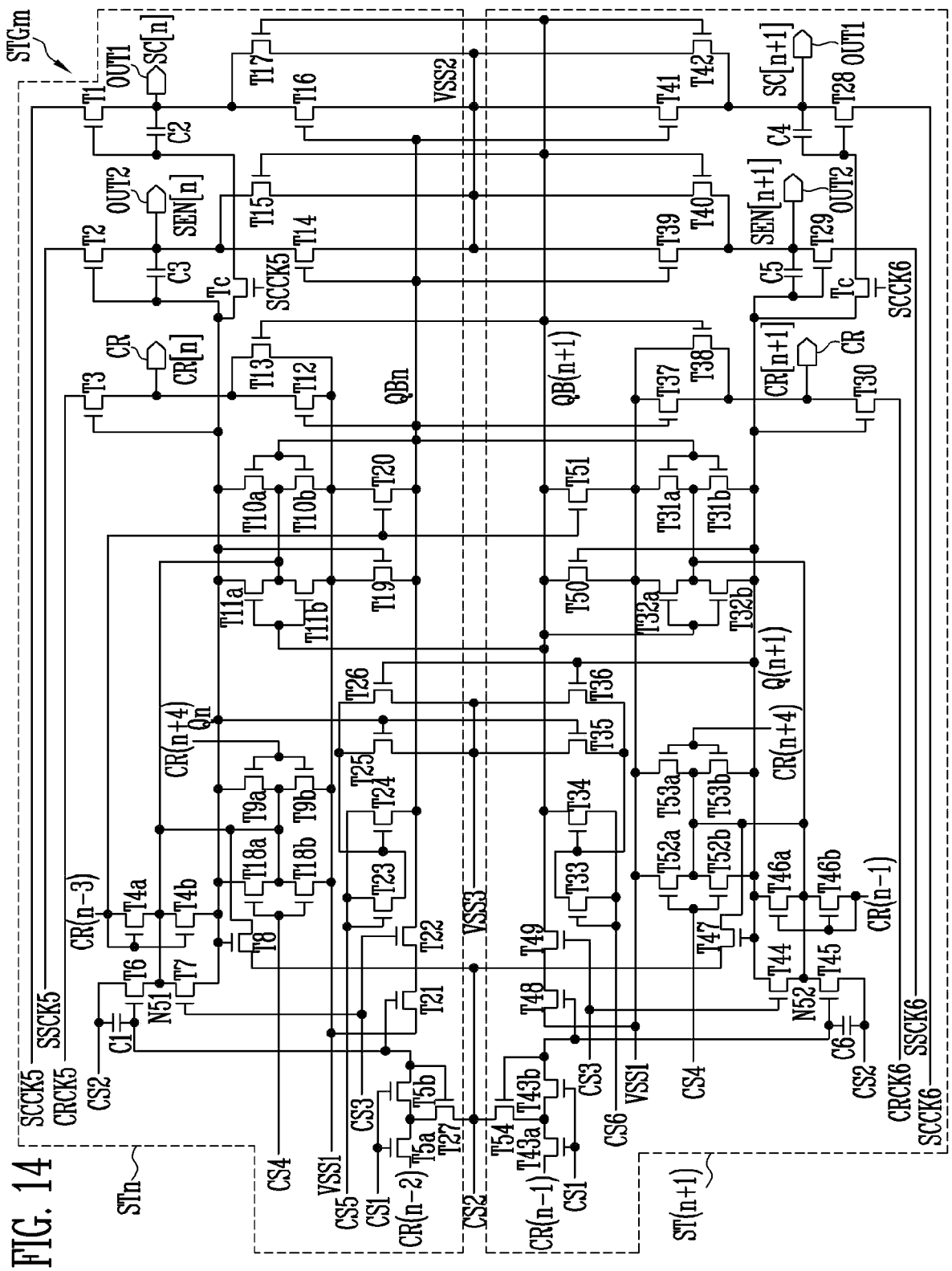
FIG. 14 is a circuit diagram illustrating an embodiment of a stage included in the scan driver of FIG. 13.

FIG. 13 is a circuit diagram illustrating a scan driver according to an embodiment, and FIG. 14 is a circuit diagram illustrating an embodiment of a stage included in the scan driver of FIG. 13.

Referring to FIG. 13, the scan driver 100 includes a plurality of stage groups . . . , STG(m−2), STG(m−1), STGm, STG(m+1), STG(m+2), . . . . FIG. 14 shows only a portion of the scan driver 100 necessary for description.

Each of the stage groups STG(m−2) to STG(m+2) may include a first stage and a second stage. The first stage may be an odd-numbered stage, and the second stage may be an even-numbered stage. For example, the stage group STG (m−2) may include a first stage ST(n−4) and a second stage ST(n−3), the stage group STG(m−1) may include a first stage ST(n−2) and a second stage ST(n−1), and the stage group STGm may include a first stage STn and a second stage ST(n+1). The parameters m and n may be integers which are not 0.

Each of the stages ST(n−4) to ST(n+5) may be connected to first to sixth control lines CS1, CS2, CS3, CS4, CS5, and CS6. Common control signals may be applied to the stages ST(n−4) to ST(n+5) through the first to sixth control lines CS1 to CS6.

Each of the stages ST(n−4) to ST(n+5) may be connected to corresponding clock lines among corresponding scan clock lines SCCK1, SCCK2, SCCK3, SCCK4, SCCK5, and SCCK6, sensing clock lines SSCK1, SSCK2, SSCK3, SSCK4, SSCK5, and SSCK6, and carry clock lines CRCK1, CRCK2, CRCK3, CRCK4, CRCK5, and CRCK6.

For example, the first stage ST(n−4) may be connected to the scan clock line SCCK1, the sensing clock line SSCK1, and the carry clock line CRCK1, and the second stage ST(n−3) may be connected to the scan clock line SCCK2, the sensing clock line SSCK2, and the carry clock line CRCK2. The first stage ST(n−2) may be connected to the scan clock line SCCK3, the sensing clock line SSCK3, and the carry clock line CRCK3, and the second stage ST(n−1) may be connected to the scan clock line SCCK4, the sensing clock line SSCK4, and the carry clock line CRCK4.

Input signals for each of the stages ST(n−4) to ST(n+5) are applied to each of the above-described first to sixth control lines CS1 to CS6, scan clock lines SCCK1 to SCCK6, sensing clock lines SSCK1 to SSCK6, and carry clock lines CRCK1 to CRCK6.

Each of the stages ST(n−4) to ST(n+5) may be connected to output terminals to which corresponding signals among scan signals SC[n−4] to SC[n+5], sensing signals SEN[n−4] to SEN[n+5]), and carry signals CR[n−4] to CR[n+5] are applied.

Referring to FIG. 14, the stage group STGm including the first stage STn and the second stage ST(n+1) is shown. Since the other stage groups of FIG. 14 also include substantially the same configuration as that of FIG. 14, a repetitive description is omitted.

First, the first stage STn may include transistors T1 to T27 and capacitors C1 to C3. Hereinafter, it is assumed that the transistors T1 to T54 are N-type transistors (for example, NMOS). Some or all of the transistors T1 to T54 may be replaced with a P-type transistor (for example, PMOS) to configure the stage group STGm.

The first transistor T1 may be connected to the first scan clock line SCCK5 and the first output terminal OUT1, and a gate electrode of the first transistor T1 may be connected to one electrode of a control transistor Tc.

The first transistor T1 may output the n-th scan signal SC[n] corresponding to the scan clock signal supplied to the first scan clock line SCCK5 in response to a voltage supplied from one electrode of the control transistor Tc to the first output terminal OUT1.

The second transistor T2 may be connected to the first sensing clock line SSCK5 and the second output terminal OUT2, and a gate electrode of the second transistor T2 may be connected to a first Q node Qn. In an embodiment, the first Q node Qn is a gate node of a pull-up transistor of a stage of the scan driver 100.

The second transistor T2 may output the n-th sensing signal SEN[n] corresponding to the sensing clock signal supplied to the first sensing clock line SSCK5 in response to a voltage of the first Q node Qn to the second output terminal OUT2.

The third transistor T3 may be connected to the first carry clock line CRCK5 and the carry output terminal CR, and a gate electrode of the third transistor T3 may be connected to the first Q node Qn.

The third transistor T3 may output the n-th carry signal CR[n] corresponding to the carry clock signal supplied to the first carry clock line CRCK5 in response to the voltage of the first Q node Qn to the carry output terminal CR.

The control transistor Tc may have a gate electrode connected to the first scan clock line SCCK5, one electrode connected to a gate electrode of the first transistor T1, and another electrode connected to the first Q node Qn.

The control transistor Tc may supply the voltage corresponding to the first Q node Qn to the gate electrode of the first transistor T1 in response to the scan clock signal supplied to the first scan clock line SCCK5.

The scan driver 100 according to an embodiment may include the control transistor Tc to control driving of the first transistor T1 from which the n-th scan signal SC[n] is output through the control transistor Tc.

The fourth transistor may have a gate electrode and one electrode connected to the first scan carry line CR(n−3), and another electrode connected to the first Q node Qn. For example, a carry signal output from the stage ST(n−3) may be applied to the first scan carry line CR(n−3). According to an embodiment, the fourth transistor includes sub transistors T4*a* and T4*b* connected in series. The sub transistor T4*a* may have a gate electrode and one electrode connected to the first scan carry line CR(n−3), and another electrode connected to a fifty-first node N51. The sub transistor T4*b* may have a gate electrode connected to the first scan carry line CR(n−3), one electrode connected to the fifty-first node N51, and another electrode connected to the first Q node Qn.

The fifth transistor may have a gate electrode connected to the first control line CS1, one electrode connected to the first sensing carry line CR(n−2), and another electrode connected to another electrode of the first capacitor C1. For example, a carry signal output from the stage ST(n−2) may be applied to the first sensing carry line CR(n−2). According to an embodiment, the fifth transistor may include sub transistors T5*a* and T5*b* connected in series. The sub transistor T5*a* may have a gate electrode connected to the first control line CS1, one electrode connected to the first sensing carry line CR(n−2), and another electrode connected to one electrode of the sub transistor T5*b*. The sub transistor T5*b* may have a gate electrode connected to the first control line CS1, one electrode connected to the other electrode of the sub transistor T5*a*, and another electrode connected to the other electrode of the first capacitor C1.

The sixth transistor T6 may have a gate electrode connected to the other electrode of the fifth transistor, one electrode connected to the second control line CS2, and another electrode connected to the fifty-first node N51.

The first capacitor C1 may have one electrode connected to one electrode of the sixth transistor T6 and the other electrode connected to the gate electrode of the sixth transistor T6.

The seventh transistor T7 may have a gate electrode connected to the third control line CS3, one electrode connected to the fifty-first node N51, and another electrode connected to the first Q node Qn.

The eighth transistor T8 may have a gate electrode connected to the first Q node Qn, one electrode connected to the second control line CS2, and another electrode connected to the fifty-first node N51.

The second capacitor C2 may have one electrode connected to the gate electrode of the first transistor T1 and another electrode connected to the other electrode of the first transistor T1.

The third capacitor C3 may have one electrode connected to the gate electrode of the second transistor T2, and another electrode connected to the other electrode of the second transistor T2.

The ninth transistor may have a gate electrode connected to the first reset carry line CR(n+4), one electrode connected to the first Q node Qn, and another electrode connected to the first power VSS1. For example, a carry signal output from the stage ST(n+4) may be applied to the first reset carry line CR(n+4). According to an embodiment, the ninth transistor may include sub transistors T9*a* and T9*b* connected in series. The sub transistor T9*a* may have a gate electrode connected to the first reset carry line CR(n+4), one electrode connected to the first Q node Qn, and another electrode connected to the fifty-first node N51. The sub transistor T9*b* may have a gate electrode connected to the first reset carry line CR(n+4), one electrode connected to the fifty-first node N51, and another electrode connected to the first power VSS1.

The tenth transistor may have a gate electrode connected to a first QB node QBn, one electrode connected to the first Q node Qn, and another electrode connected to the first power VSS1. According to an embodiment, the tenth transistor may include sub transistors T10*a* and T10*b* connected in series. The sub transistor T10*a* may have a gate electrode connected to the first QB node QBn, one electrode connected to the first Q node Qn, and another electrode connected to the fifty-first node N51. The sub transistor T10*b* may have a gate electrode connected to the first QB node QBn, one electrode connected to the fifty-first node N51, and another electrode connected to the first power VSS1.

The eleventh transistor may have a gate electrode connected to a second QB node QB(n+1), one electrode connected to the first Q node Qn, and another electrode connected to the first power VSS1. In an embodiment, the second Q node QB(n+1) is a gate node of a pull-up transistor of a second stage of the scan driver 100. According to an embodiment, the eleventh transistor may include sub transistors T11*a* and T11*b* connected in series. The sub transistor T11*a* may have a gate electrode connected to the second QB node QB(n+1), one electrode connected to the first Q node Qn, and another electrode connected to the fifty-first node N51. The sub transistor T11*b* may have a gate electrode connected to the second QB node QB(n+1), one electrode connected to the fifty-first node N51, and another electrode connected to the first power VSS1.

The twelfth transistor T12 may have a gate electrode connected to the first QB node QBn, one electrode connected to the carry output terminal CR, and another electrode connected to the first power VSS1.

The thirteenth transistor T13 may have a gate electrode connected to the second QB node QB(n+1), one electrode connected to the carry output terminal CR, and another electrode connected to the first power VSS1.

The fourteenth transistor T14 may have a gate electrode connected to the first QB node QBn, one electrode connected to the second output terminal OUT2, and another electrode connected to the second power VSS2.

The fifteenth transistor T15 may have a gate electrode connected to the second QB node QB(n+1), one electrode connected to the second output terminal OUT2, and another electrode connected to the second power VSS2.

The sixteenth transistor T16 may have a gate electrode connected to the first QB node QBn, one electrode connected to the first output terminal OUT1, and another electrode connected to the second power VSS2.

The seventeenth transistor T17 may have a gate electrode connected to the second QB node QB(n+1), one electrode connected to the first output terminal OUT1, and another electrode connected to the second power VSS2.

The eighteenth transistor may have a gate electrode connected to the fourth control line CS4, one electrode connected to the first Q node Qn, and another electrode connected to the first power VSS1. According to an embodiment, the eighteenth transistor may include sub transistors T18a and T18b connected in series. The sub transistor T18a may have a gate electrode connected to the fourth control line CS4, one electrode connected to the first Q node Qn, and another electrode connected to the fifty-first node N51. The sub transistor T18b may have a gate electrode connected to the fourth control line CS4, one electrode connected to the fifty-first node N51, and another electrode connected to the first power VSS1.

The nineteenth transistor T19 may have a gate electrode connected to the first Q node Qn, one electrode connected to the first power VSS1, and another electrode connected to the first QB node QBn.

The twentieth transistor T20 may have a gate electrode connected to the first scan carry line CR(n−3), one electrode connected to the first power VSS1, and another electrode connected to the first QB node QBn.

The twenty-first transistor T21 may have a gate electrode connected to the other electrode of the fifth transistor, one electrode connected to the first power VSS1, and another electrode connected to one electrode of the twenty-second transistor T22.

The twenty-second transistor T22 may have a gate electrode connected to the third control line CS3, the one electrode connected to the other electrode of the twenty-first transistor T21, and another electrode connected to the first QB node QBn.

The twenty-third transistor T23 may have a gate electrode and one electrode connected to the fifth control line CS5, and another electrode connected to a gate electrode of the twenty-fourth transistor T24.

The twenty-fourth transistor T24 may have the gate electrode connected to the other electrode of the twenty-third transistor T23, one electrode connected to the fifth control line CS5, and another electrode connected to the first QB node QBn.

The twenty-fifth transistor T25 may have a gate electrode connected to the first Q node Qn, one electrode connected to the gate electrode of the twenty-fourth transistor T24, and another electrode connected to a third power line VSS3.

The twenty-sixth transistor T26 may have a gate electrode connected to a second Q node Q(n+1), one electrode connected to the gate electrode of the twenty-fourth transistor T24, and another electrode connected to the third power line VSS3.

The twenty-seventh transistor T27 may have a gate electrode connected to the other electrode of the sub transistor T5b, one electrode connected to the one electrode of the sub transistor T5b, and another electrode connected to the second control line CS2.

Next, the second stage ST(n+1) may include transistors T28 to T54 and capacitors C4 to C6.

The twenty-eighth transistor T28 may be connected between the first output terminal OUT1 and the second scan clock line SCCK6, and a gate electrode of the twenty-eighth transistor T28 may be connected to one electrode of the control transistor Tc.

The twenty-eighth transistor T28 may output and the (n+1)-th scan signal SC[n+1] corresponding to the scan clock signal supplied to the second scan clock line SCCK6 to the first output terminal OUT1, in response to a voltage supplied from one electrode of the control transistor Tc.

The fourth capacitor C4 may connect the gate electrode and one electrode of the twenty-eighth transistor T28.

The twenty-ninth transistor T29 may be connected between the second output terminal OUT2 and the second sensing clock line SSCK6, and a gate electrode of the twenty-ninth transistor T29 may be connected to the second Q node Q(n+1).

The twenty-ninth transistor T29 may output the (n+1)-th sensing signal SEN[n+1] corresponding to the sensing clock signal supplied to the second sensing clock line SCCK6 in response to a voltage of the second Q node Q(n+1) to the second output terminal OUT2.

The fifth capacitor C5 may connect the gate electrode and one electrode of the twenty-ninth transistor T29.

The thirtieth transistor T30 may be connected between the second carry line CR(n+1) and the second carry clock line CRCK6, and a gate electrode may be connected to the second Q node Q(n+1).

The thirtieth transistor T30 may output the (n+1)-th carry signal CR[n+1] corresponding to the carry clock signal supplied to the second carry clock line CRCK6 in response to the voltage of the second Q node Q(n+1) to the carry output terminal CR.

The control transistor Tc may have a gate electrode connected to the second scan clock line SCCK6, one electrode connected to the gate electrode of the twenty-eighth transistor T28, and another electrode connected to the second Q node Q(n+1).

The control transistor Tc may supply the voltage corresponding to the second Q node Q(n+1) to the gate electrode of the twenty-eighth transistor T28 in response to the scan clock signal supplied to the second scan clock line SCCK6.

The scan driver 100 according to an embodiment may include a control transistor Tc to control driving of the twenty-eighth transistor T28 from which the (n+1)-th scan signal SC[n+1] is output through the control transistor Tc.

The thirty-first transistor may have a gate electrode connected to the first QB node QBn, one electrode connected to the first power VSS1, and another electrode connected to the second Q node Q(n+1). According to an embodiment, the thirty-first transistor may include sub transistors T31a and T31b connected in series. The sub transistor T31a may have a gate electrode connected to the first QB node QBn, one electrode connected to the first power VSS1, and another electrode connected to a fifty-second node N52. The sub transistor T31b may have a gate electrode connected to the first QB node QBn, one electrode connected to the fifty-second node N52, and another electrode connected to the second Q node Q(n+1).

The thirty-second transistor may have a gate electrode connected to the second QB node (QB(n+1), one electrode connected to the first power VSS1, and another electrode connected to the second Q node (Q(n+1)). According to an embodiment, the thirty-second transistor may include sub transistors T32a and T32b connected in series. The sub transistor T32a may have a gate electrode connected to the second QB node QB(n+1), one electrode connected to the first power VSS1, and another electrode connected to the fifty-second node N52. The sub transistor T32b may have a gate electrode connected to the second QB node QB(n+1), one electrode connected to the fifty-second node N52, and another electrode connected to the second Q node Q(n+1).

The thirty-third transistor T33 may have a gate electrode connected to the sixth control line CS6, one electrode connected to a gate electrode of the thirty-fourth transistor T34, and another electrode connected to the sixth control line CS6.

The thirty-fourth transistor T34 may have a gate electrode connected to the one electrode of the thirty-third transistor T33, one electrode connected to the second QB node QB(n+1), and another electrode connected to the sixth control line CS6.

The thirty-fifth transistor T35 may have a gate electrode connected to the first Q node Qn, one electrode connected to the third power line VSS3, and another electrode connected to the gate electrode of the thirty-fourth transistor T34.

The thirty-sixth transistor T36 may have a gate electrode connected to the second Q node Q(n+1), one electrode connected to the third power line VSS3, and another electrode connected to the gate electrode of the thirty-fourth transistor T34.

The thirty-seventh transistor T37 may have a gate electrode connected to the first QB node QBn, one electrode connected to the first power VSS1, and another electrode connected to the carry output terminal CR.

The thirty-eighth transistor T38 may have a gate electrode connected to the second QB node QB(n+1), one electrode connected to the first power VSS1, and another electrode connected to the carry output terminal CR.

The thirty-ninth transistor T39 may have a gate electrode connected to the first QB node QBn, one electrode connected to the second power VSS2, and another electrode connected to the second output terminal OUT2.

The fortieth transistor T40 may have a gate electrode connected to the second QB node QB(n+1), one electrode connected to the second power VSS2, and another electrode connected to the second output terminal OUT2.

The forty-first transistor T41 may have a gate electrode connected to the first QB node QBn, one electrode connected to the second power VSS2, and another electrode connected to the first output terminal OUT1.

The forty-second transistor T42 may have a gate electrode connected to the second QB node QB(n+1), one electrode connected to the second power VSS2, and another electrode connected to the first output terminal OUT1.

The forty-third transistor may have a gate electrode connected to the first control line CS1, one electrode connected to the second sensing carry line CR(n−1), and another electrode connected to the fifty-second node N52. For example, a carry signal output from the stage ST(n−1) may be applied to the second sensing carry line CR(n−1). According to an embodiment, the forty-third transistor may include sub transistors T43a and T43b connected in series. The sub transistor T43a may have a gate electrode connected to the first control line CS1, one electrode connected to the second sensing carry line CR(n−1), and another electrode connected one electrode of the sub transistor T43b. The sub transistor T43b may have a gate electrode connected to the first control line CS1, one electrode connected to the other electrode of the sub transistor T43a, and another electrode connected to the gate electrode of the forty-fifth transistor T45.

The forty-fourth transistor T44 may have a gate electrode connected to the third control line CS3, one electrode connected to the second Q node Q(n+1), and another electrode connected to the fifty-second node N52.

The forty-fifth transistor T45 may have a gate electrode connected to the other electrode of the forty-third transistor, one electrode connected to the fifty-second node N52, and another electrode connected to the second control line CS2.

The sixth capacitor C6 may have one electrode connected to the gate electrode of the forty-fifth transistor T45 and another electrode connected to the other electrode of the forty-fifth transistor T45.

The forty-sixth transistor may have one electrode connected to the second Q node Q(n+1), and a gate electrode and another electrode connected to the second scan carry line CR(n−1). The carry signal output from the stage ST(n−1) may be applied to the second scan carry line CR(n−1). According to an embodiment, the forty-sixth transistor may include sub transistors T46a and T46b connected in series. The sub transistor T46a may have a gate electrode connected to the second scan carry line CR(n−1), one electrode connected to the second Q node Q(n+1), and another electrode connected to the forty-second node N52. The sub transistor T46b may have a gate electrode connected to the second scan carry line CR(n−1), one electrode connected to the fifty-second node N52, and another electrode connected to the second scan carry line CR(n−1).

The forty-seventh transistor T47 may have a gate electrode connected to the second Q node Q(n+1), one electrode connected to the second control line CS2, and another electrode connected to the fifty-second node N52.

The forty-eighth transistor T48 may have a gate electrode connected to the other electrode of the forty-third transistor, one electrode connected to the first power VSS1, and another electrode connected to one electrode of the forty-ninth transistor T49.

The forty-ninth transistor T49 may have a gate electrode connected to the third control line CS3, the one electrode connected to the other electrode of the forty-eighth transistor T48, and another electrode connected to the second QB node QB(n+1).

The fiftieth transistor T50 may have a gate electrode connected to the second Q node Q(n+1), one electrode connected to the second QB node QB(n+1), and another electrode connected to the first power VSS1.

The fifty-first transistor T51 may have a gate electrode connected to the first scan carry line CR(n−1), one electrode connected to the second QB node QB(n+1), and another electrode connected to the first power VSS1.

The fifty-second transistor may have a gate electrode connected to the fourth control line CS4, one electrode connected to the first power VSS1, and another electrode connected to the second Q node Q(n+1). According to an embodiment, the fifty-second transistor may include sub transistors T52a and T52b connected in series. The sub transistor T52a may have a gate electrode connected to the fourth control line CS4, one electrode connected to the first power VSS1, and another electrode connected to the fifty-second node N52. The sub transistor T52b may have a gate electrode connected to the fourth control line CS4, one electrode connected to the fifty-second node N52, and another electrode connected to the second Q node Q(n+1).

The fifty-third transistor may have a gate electrode connected to the first reset carry line CR(n+4), one electrode connected to the first power VSS1, and another electrode connected to the second Q node Q(n+1). According to an embodiment, the fifty-third transistor may include sub transistors T53a and T53b connected in series. The sub transistor T53a may have a gate electrode connected to the first reset carry line CR(n+4), one electrode connected to the first power VSS1, and another electrode connected to the fifty-second node N52. The sub transistor T53b may have a gate electrode connected to the first reset carry line CR(n+4), one electrode connected to the fifty-second node N52, and another electrode connected to the second Q node Q(n+1).

The fifty-fourth transistor T54 may have a gate electrode connected to the other electrode of the sub transistor T43b, one electrode connected to the second control line CS2, and another electrode connected to the one electrode of the sub transistor T43b.

Hereinafter, a structure of a display device according to an embodiment is described with reference to FIG. 15.

Figure 15:
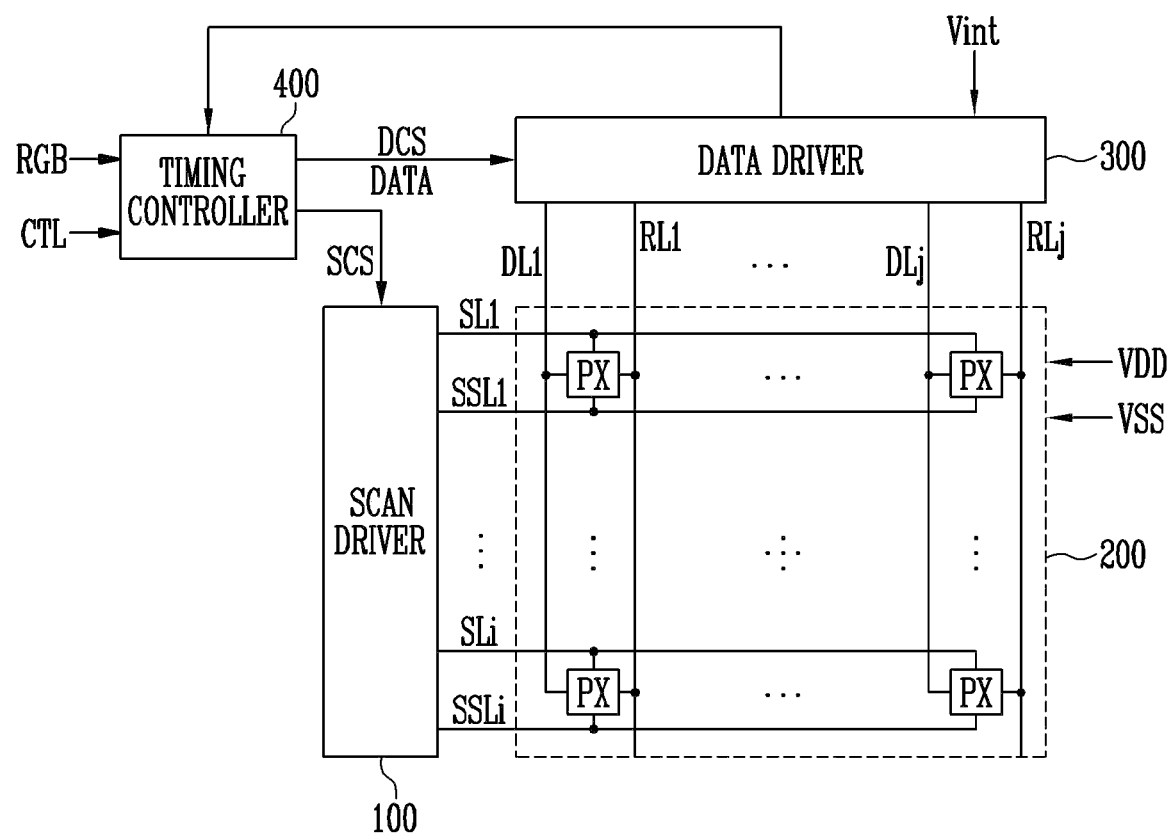
FIG. 15 is a block diagram schematically illustrating a display device according to an embodiment.

FIG. 15 is a block diagram schematically illustrating a display device according to an embodiment.

Referring to FIG. 15, the display device may include the scan driver 100, the pixel unit 200, the data driver 300, and the timing controller 400. The display device shown in FIG. 15 is similar to the display device of FIG. 1 described above. Therefore, hereinafter, differences are mainly described.

The data driver 300 may provide the data voltage to the data lines DL1 to DLj, and receive at least one sensing current from at least one of the pixels PX through the sensing lines RL1 to RLj. In addition, the data driver 300 may supply the initialization voltage Vint supplied from the outside to the sensing lines RL1 to RLj (j is a natural number) under the control of the timing controller 400. That is, according to an embodiment, the compensator 500 of FIG. 1 described above may be implemented together in the data driver 300.

The data driver 300 may calculate a characteristic of the driving transistor based on the sensing current and provide sensing data corresponding to the calculated characteristic to the timing controller 400. The timing controller 400 may compensate for the digital image data and/or the data signal based on the sensing data, and provide a compensated data voltage to the data driver 300. Accordingly, the data driver 300 may supply the compensated data voltage to the pixel unit 200.

At least one embodiment of the disclosure provides a scan driver including a first input unit controlling a voltage of a first node in response to a previous carry signal, a scan output unit outputting a current scan signal corresponding to a scan clock signal in response to the voltage of the first node, a first switching unit controlling a voltage of a second node in response to the previous carry signal, a sensing output unit outputting a current sensing signal corresponding to a sensing clock signal in response to the voltage of the second node, a carry output unit outputting a current carry signal corresponding to a carry clock signal in response to the voltage of the second node, and a second switching unit controlling the voltage of the second node in response to the sensing clock signal or the carry clock signal.

Although the disclosure has been described with reference to certain embodiments above, those skilled in the art will understand that the disclosure may be various modified and changed without departing from the technical spirit of the accompanying claims.

What is claimed is:

1. A scan driver comprising:
   a plurality of stages, wherein an n-th stage among the plurality of stages comprises:
   a first input unit controlling a voltage of a first node in response to a previous carry signal, wherein the first input unit includes a first transistor connected to the first node and receiving the previous carry signal to form a first diode connection structure;
   a scan output unit outputting a current scan signal corresponding to a scan clock signal in response to the voltage of the first node;
   a first switching unit controlling a voltage of a second node in response to the previous carry signal, wherein the first switching unit includes a third transistor connected to the second node and receiving the previous carry signal to form a second diode connection structure;
   a sensing output unit outputting a current sensing signal corresponding to a sensing clock signal in response to the voltage of the second node;
   a carry output unit outputting a current carry signal corresponding to a carry clock signal in response to the voltage of the second node; and
   a second switching unit controlling the voltage of the second node in response to the sensing clock signal or the carry clock signal.

2. The scan driver according to claim 1, wherein the n-th stage further comprises a second input unit controlling the voltage of the first node in response to a next carry signal.

3. The scan driver according to claim 2, wherein the n-th stage further comprises a third switching unit controlling the voltage of the first node in response to the scan clock signal.

4. The scan driver according to claim 3, wherein the voltage of the first node is discharged by the second input unit, and the voltage of the second node is not discharged.

5. The scan driver according to claim 3, wherein the first input unit includes the first transistor connected between a first input terminal and the first node, and having a gate electrode connected to the first input terminal, the scan output unit includes a second transistor connected between a scan clock input terminal and a first output terminal, and having a gate electrode connected to the first node, the first switching unit includes the third transistor connected between the first input terminal and the second node, and having a gate electrode connected to the first input terminal, the sensing output unit includes a fourth transistor connected between a sensing clock input terminal and a second output terminal, and having a gate electrode connected to the second node, and the carry output unit includes a fifth transistor connected between a carry clock input terminal and a carry output terminal, and having a gate electrode connected to the second node.

6. The scan driver according to claim 5, wherein the second switching unit includes a sixth transistor connected between the second node and a third node, and having a gate electrode connected to the sensing clock input terminal or the carry clock input terminal, and the third switching unit includes a seventh transistor connected between the first node and the third node, and having a gate electrode connected to the scan clock input terminal.

7. The scan driver according to claim 6, wherein the second input unit includes an eighth transistor connected between the first node and a second power input terminal, and having a gate electrode connected between a second input terminal.

8. The scan driver according to claim 7, wherein an output unit includes the scan output unit, the carry output unit, and the sensing output unit, and the output unit includes a ninth transistor connected between a first power input terminal and the first output terminal, and having a gate electrode connected to a fourth node, a tenth transistor connected between the second power input terminal and the carry output terminal, and having a gate electrode connected to the fourth node, an eleventh transistor connected between the second power input terminal and the carry output terminal, and having a gate electrode connected to the second input terminal, a twelfth transistor connected between the first power input terminal and the second output terminal, and having a gate electrode connected to the fourth node, and a thirteenth transistor connected between the first power input terminal and the second output terminal, and having a gate electrode connected to the second input terminal.

9. The scan driver according to claim 8, wherein the n-th stage further comprises a first control unit controlling a voltage of the first output terminal in response to the next carry signal, and the first control unit includes a fourteenth transistor connected between the first power input terminal and the first output terminal, and having a gate electrode connected to the second input terminal.

10. The scan driver according to claim 9, wherein the n-th stage further comprises a second control unit controlling a voltage of the third node in response to a voltage of the fourth node, and the second control unit includes a fifteenth transistor connected between the second power input terminal and the third node, and having a gate electrode connected to the fourth node.

11. The scan driver according to claim 10, wherein the n-th stage further comprises a third control unit controlling the voltage of the fourth node in response to the carry clock signal and the current carry signal, and the third control unit includes a sixteenth transistor connected between the carry clock input terminal and a fifth node, and having a gate electrode connected to the carry clock input terminal, a seventeenth transistor connected between the carry clock input terminal and the fourth node, and having a gate electrode connected to the fifth node, an eighteenth transistor connected between the first power input terminal and the fifth node, and having a gate electrode connected to the carry output terminal, and a nineteenth transistor connected between the second power input terminal and the fourth node, and having a gate electrode connected to the carry output terminal.

12. The scan driver according to claim 11, wherein the n-th stage further comprises a leakage control unit supplying a control voltage supplied to a third input terminal in response to the current scan signal and the current sensing signal to the first input unit, the second input unit, and the first switching unit, and the leakage control unit includes a twentieth transistor connected between the third input terminal and a sixth node, and having a gate electrode connected to the first output terminal, and a twenty-first transistor connected between the third input terminal and the sixth node, and having a gate electrode connected to the second output terminal.

13. The scan driver according to claim 12, wherein the n-th stage further comprises a first reset unit resetting the voltage of the first node in response to a reset signal supplied to a fourth input terminal, and the first reset unit includes twenty-second transistor connected between the second power input terminal and the first node, and having a gate electrode connected to the fourth input terminal.

14. The scan driver according to claim 2, wherein the voltage of the first node is discharged by the second input unit, and the voltage of the second node is not discharged.

15. The scan driver according to claim 1, wherein the n-th stage further comprises a second reset unit controlling the voltage of the second node in response to a reset signal supplied to a fourth input terminal, and the second reset unit includes a twenty-third transistor connected between a second power input terminal and the second node, and having a gate electrode connected to the fourth input terminal.

16. A scan driver comprising:
a plurality of stages, wherein an n-th stage among the plurality of stages comprises:
a first input unit controlling a voltage of a first node in response to a previous carry signal;
a second input unit controlling the voltage of the first node in response to a next carry signal;
a scan output unit outputting a current scan signal corresponding to a scan clock signal in response to the voltage of the first node;
a first switching unit controlling a voltage of a second node in response to the previous carry signal;
a sensing output unit outputting a current sensing signal corresponding to a sensing clock signal in response to the voltage of the second node;
a carry output unit outputting a current carry signal corresponding to a carry clock signal in response to the voltage of the second node; and
a second switching unit controlling the voltage of the first node in response to the scan clock signal,
wherein the voltage of the first node is discharged by the second input unit, and the voltage of the second node is not discharged.

17. A scan driver comprising:
a plurality of stages, wherein a first stage among the plurality of stages comprises:
a first transistor connected to a first scan clock line and a first output terminal, and having a gate electrode connected to one electrode of a control transistor;
a second transistor connected to a first sensing clock line and a second output terminal, and having a gate electrode connected to a first node;
a third transistor connected to a first carry clock line and a carry output terminal, and having a gate electrode connected to the first node; and
a control transistor having a gate electrode connected to the first scan clock line, one electrode connected to the gate electrode of the first transistor, and another electrode connected directly to the first node.

18. The scan driver according to claim 17, wherein a second stage among the plurality of stages comprises:
a twenty-eighth transistor connected between a first output terminal and a second scan clock line, and having a gate electrode connected to one electrode of a control transistor;
a twenty-ninth transistor connected between a second output terminal and a second sensing clock line, and having a gate electrode connected to a second node;
a thirtieth transistor connected between a second carry line and a second carry clock line, and having a gate electrode connected to the second node; and
the control transistor having a gate electrode connected to the second scan clock line, the one electrode connected to the gate electrode of the twenty-eighth transistor, and another electrode connected to the second node.

19. The scan driver according to claim 18, wherein the first output terminal outputs a scan signal, the second output terminal outputs a sensing signal, and the carry output terminal outputs a carry signal.

20. A scan driver comprising:
a plurality of stages, wherein an n-th stage among the plurality of stages comprises:

a first transistor connected between a first input terminal and a first node, and having a gate electrode and a first electrode connected to the first input terminal;

a second transistor connected between a scan clock input terminal and a first output terminal, and having a gate electrode connected to the first node;

a third transistor connected between the first input terminal and a second node, and having a gate electrode and a first electrode connected to the first input terminal;

a fourth transistor connected between a sensing clock input terminal and a second output terminal, and having a gate electrode connected to the second node; and a fifth transistor connected between a carry clock input terminal and a carry output terminal, and having a gate electrode connected to the second node.

21. The scan driver according to claim 20, further comprising:

a sixth transistor connected between the second node and a third node, and having a gate electrode connected to the sensing clock input terminal or the carry clock input terminal; and a seventh transistor connected between the first node and the third node, and having a gate electrode connected to the scan clock input terminal.

* * * * *